United States Patent
Fujii et al.

(10) Patent No.: US 7,098,993 B2
(45) Date of Patent: Aug. 29, 2006

(54) EXPOSURE DEVICE FOR EXPOSING A PHOTOSENSITIVE MATERIAL IN ACCORDANCE WITH IMAGE DATA

(75) Inventors: Takeshi Fujii, Kanagawa (JP); Yoji Okazaki, Kanagawa (JP); Mitsuru Sawano, Kanagawa (JP); Kazuhiko Nagano, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/098,755

(22) Filed: Mar. 21, 2002

(65) Prior Publication Data

US 2002/0180944 A1    Dec. 5, 2002

(30) Foreign Application Priority Data

Mar. 22, 2001  (JP) ............................. 2001-083739
Sep. 10, 2001  (JP) ............................. 2001-274359

(51) Int. Cl.
G03B 27/54   (2006.01)
G03B 27/72   (2006.01)
G06F 3/12    (2006.01)

(52) U.S. Cl. .......................... 355/70; 355/35; 358/1.1
(58) Field of Classification Search ................ 355/70, 355/22, 35; 372/68, 21, 22; 359/196, 279; 347/155, 262, 2; 430/78; 399/159; 358/1.1
See application file for complete search history.

(56) References Cited

U.S. PATENT DOCUMENTS

| | | | |
|---|---|---|---|
| 5,311,360 A | 5/1994 | Bloom et al. | |
| 5,761,226 A | 6/1998 | Gupta | |
| 5,812,152 A * | 9/1998 | Torigoe et al. | 347/2 |
| 5,838,709 A * | 11/1998 | Owa | 372/68 |
| 6,064,416 A * | 5/2000 | Esch et al. | 347/225 |
| 6,177,980 B1 | 1/2001 | Johnson | |
| 6,188,519 B1 | 2/2001 | Johnson | |
| 6,190,811 B1 * | 2/2001 | Tanaka et al. | 430/78 |
| 6,366,336 B1 * | 4/2002 | Kanno | 355/35 |
| 6,452,687 B1 * | 9/2002 | Suzuki et al. | 358/1.1 |
| 6,486,937 B1 * | 11/2002 | Morton et al. | 355/22 |
| 6,577,429 B1 * | 6/2003 | Kurtz et al. | 359/279 |
| 2001/0026313 A1 | 10/2001 | Ohba | |
| 2002/0122839 A1 * | 9/2002 | Chapman et al. | 425/174.4 |
| 2002/0126362 A1 * | 9/2002 | Shimomura | 359/196 |

FOREIGN PATENT DOCUMENTS

| | | |
|---|---|---|
| EP | 0 941 860 A2 | 9/1999 |
| EP | 0 945 276 A1 | 9/1999 |
| EP | 1 020 304 A2 | 7/2000 |
| JP | 2000-131628 | 5/2000 |

* cited by examiner

Primary Examiner—Peter B. Kim
(74) Attorney, Agent, or Firm—Sughrue Mion, PLLC

(57) ABSTRACT

An inexpensive and highly productive exposure device for directly scanning and exposing a photosensitive material sensitive to at least a UV region, based on digital data. As a motor controller moves an exposure head at a fixed speed in Y direction, image data is read one line of image data, each GLV element of a light modulator array is switched on/off by the read image data, and laser light from a high power light source of the exposure head is switched on/off. A UV-sensitive object to be exposed is exposed in X direction in a number of pixel units that substantially corresponds to the number of the GLV elements. The image data is scanned and exposed by one line in Y direction (main-scan). The motor controller moves a flat stage by one step in X direction (sub-scan). The object to be exposed is imagewise-exposed by repeating such scans.

13 Claims, 26 Drawing Sheets

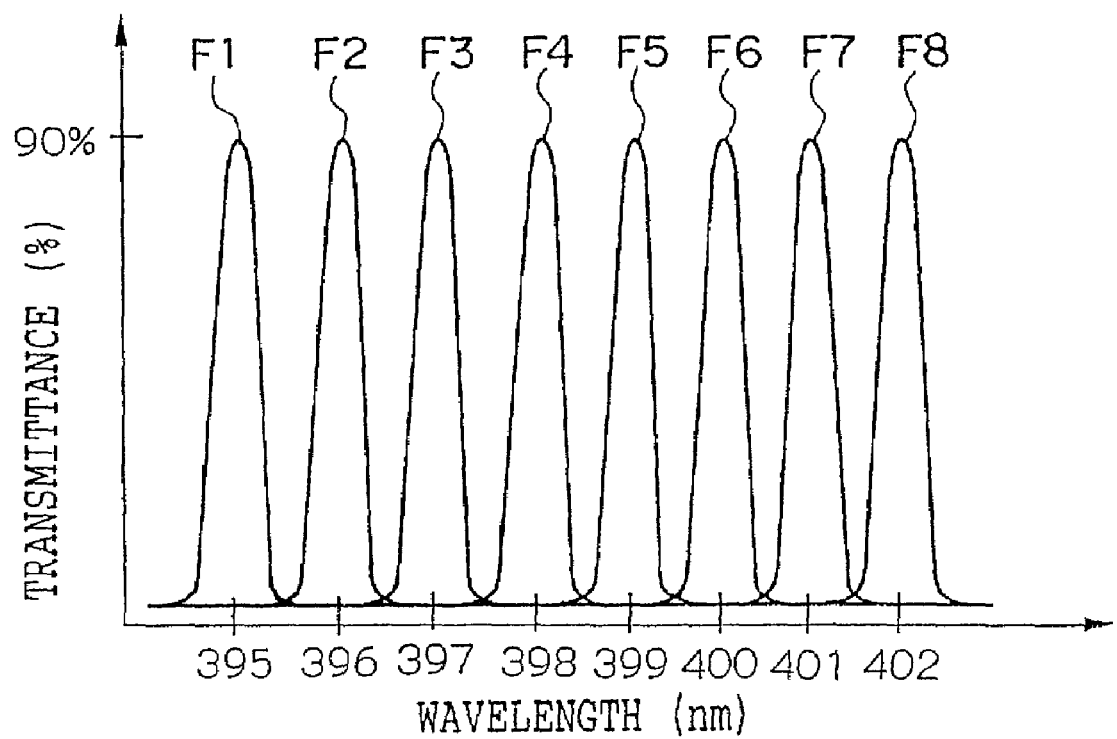
F I G. 5

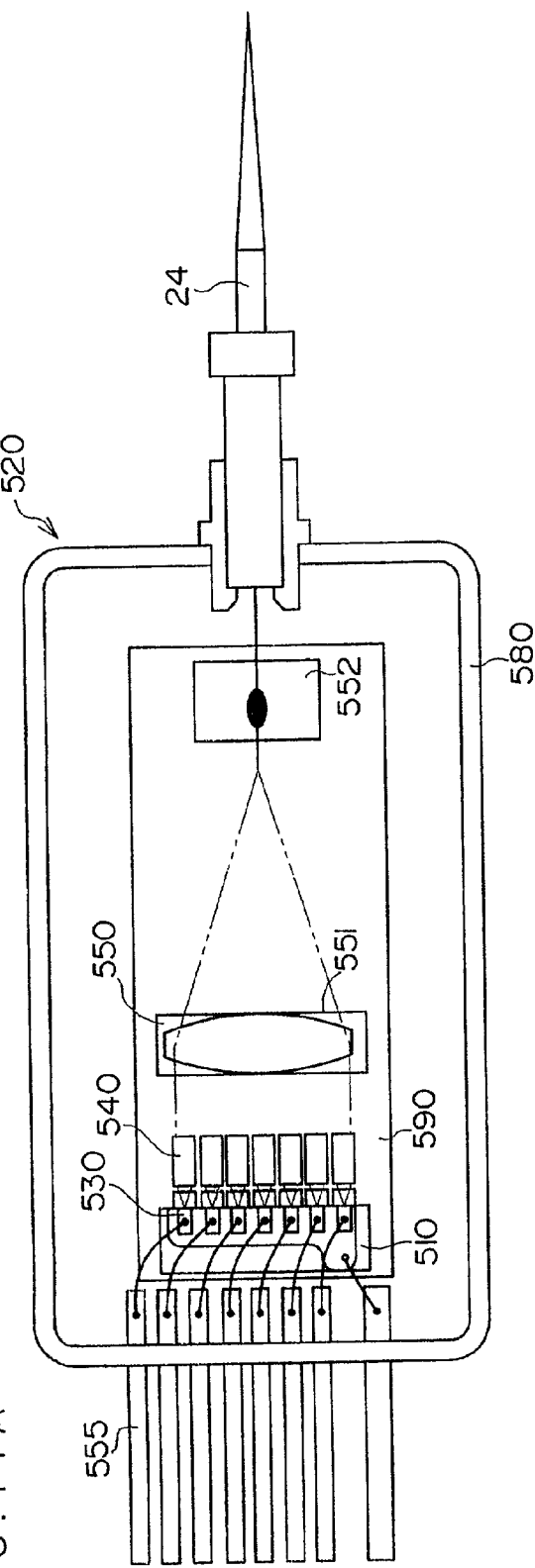
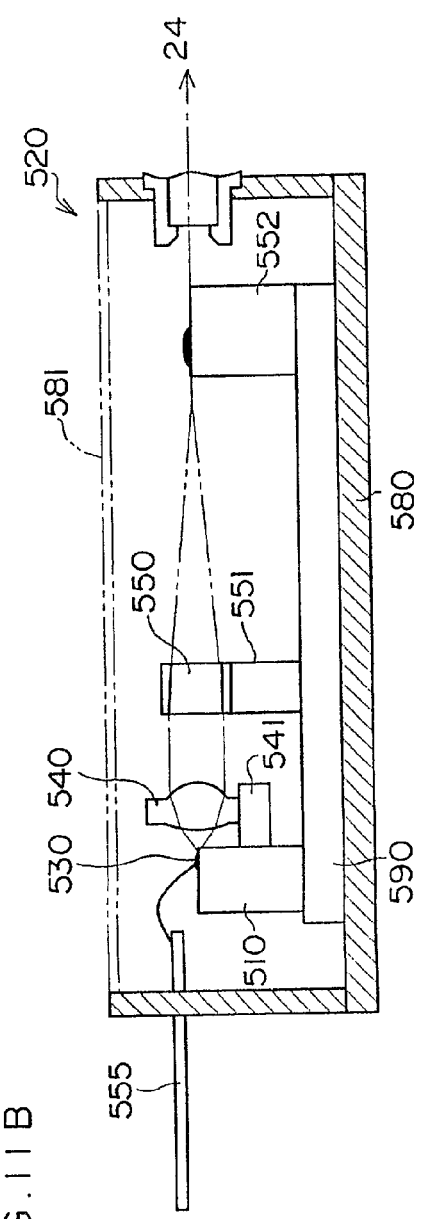
FIG. 11A
FIG. 11B

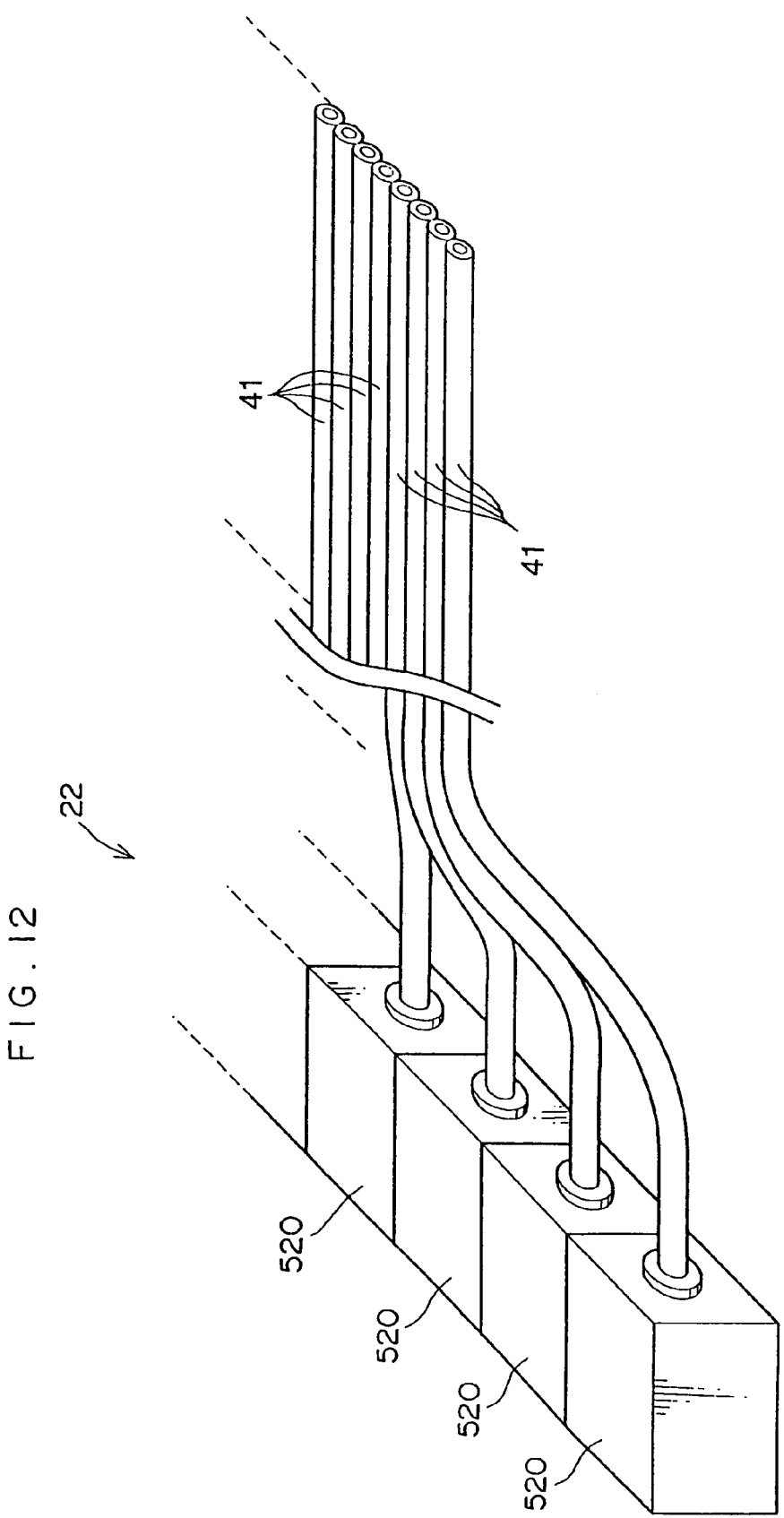

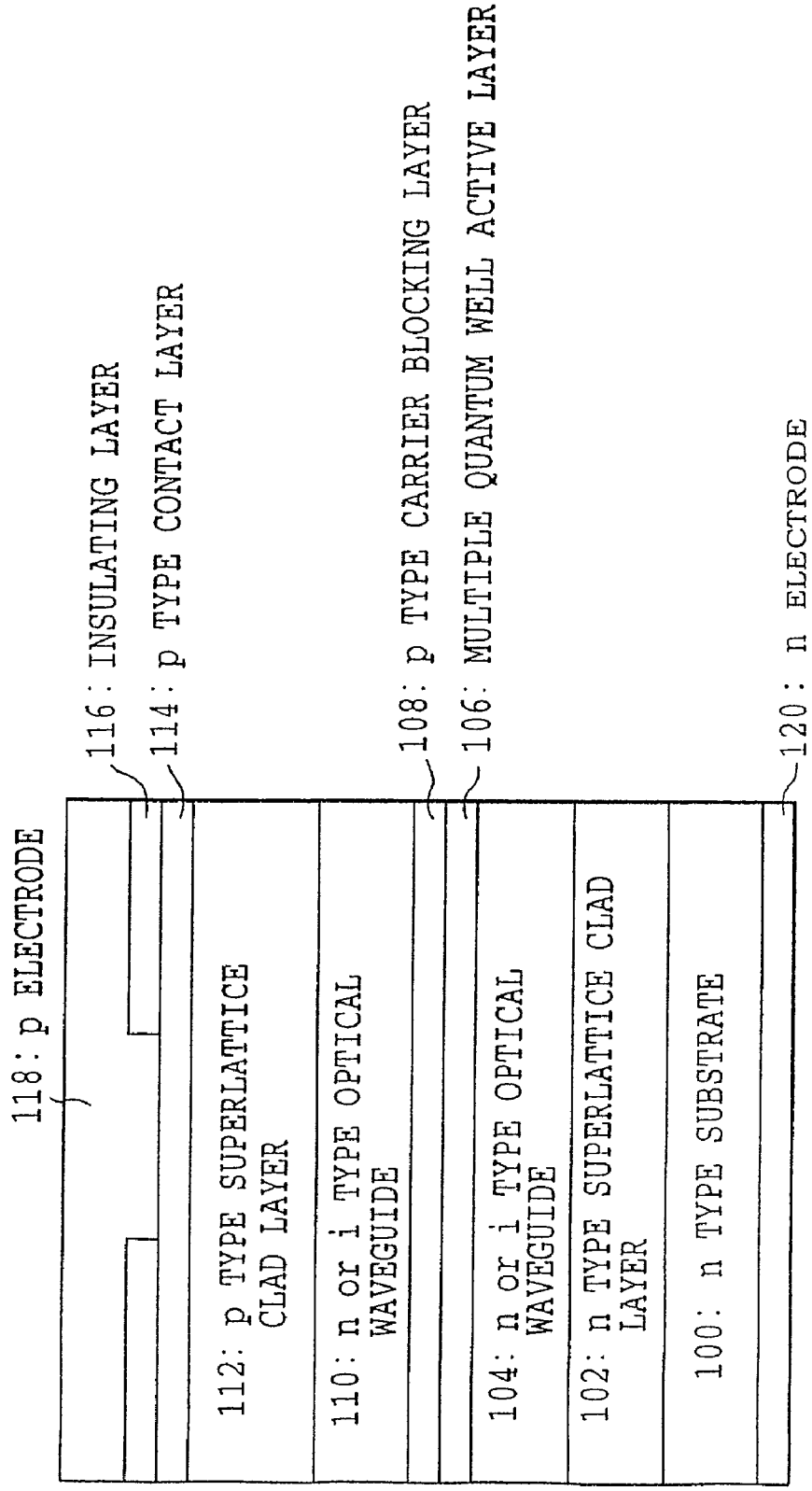

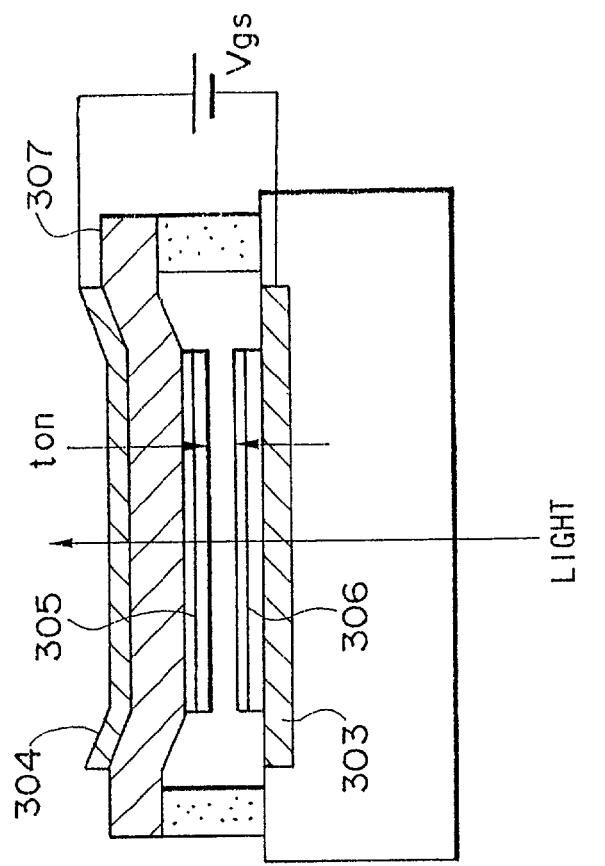
FIG. 23B (POWER ON)
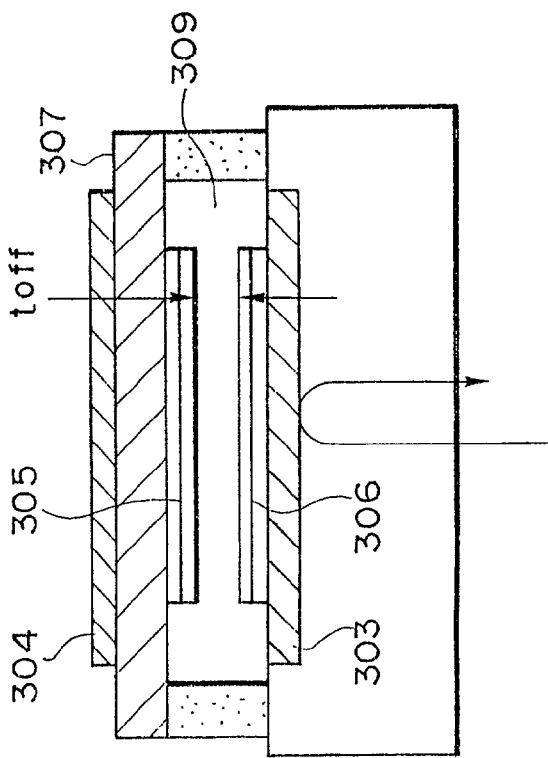
FIG. 23A (POWER OFF)

EXPOSURE DEVICE FOR EXPOSING A PHOTOSENSITIVE MATERIAL IN ACCORDANCE WITH IMAGE DATA

BACKGROUND OF THE INVENTION

1. Field of the Invention

The present invention relates to an exposure device. More particularly, the present invention relates to an exposure device which scans and exposes a photosensitive layer which is sensitive to a predetermined wavelength region including a UV region (350 nm to 420 nm), with a continuously driven or pulse-driven light beam which is emitted from a high-power laser light source.

2. Description of the Related Art

A liquid crystal display (LCD) is characterized by being made more compact and thinner than a conventional CRT (cathode ray tube), and has been utilized in various fields such as portable television sets, personal computers, mobile phones, and the like, and a market therefore has been increasing. A liquid color filter is a member for achieving the color LCD, and is structured such that three original color patterns of red, green and blue are regularly arranged on a glass substrate. In accordance with broadened applications of the LCD, there is a demand for the liquid color filters of larger size and higher accuracy.

Conventionally, an exposure device that is used during the manufacturing process of the liquid crystal display uses one of three roughly-defined methods such as a proximity method, a mirror projection method, and a stepper method. Among these, the exposure device using the proximity method is usually used for the manufacture of the liquid color filter (especially for a photolithography process). When the exposure device using the proximity method carries out photolithography, a UV light is irradiated onto one surface of a substrate through a mask to expose a photoresist (photosensitive material).

However, in the exposure device using the proximity method, since a mask and a substrate are disposed in close proximity to each other, such as a few dozen μm to expose at one time, problems described below may occur:

(1) a large and expensive mask must be used, the mask is easily damaged by contact with the substrate, and a cost of the mask increases;
(2) since the distance between the mask and the substrate during the exposure is small, a holding mechanism and an aligning mechanism with high accuracy are needed to hold and align the mask and the photosensitive material;
(3) a temperature stabilizing mechanism becomes necessary to prevent deterioration of rendering accuracy due to a thermal contraction of the mask and the substrate;
(4) since a super high pressure mercury lamp whose life duration is short is used as a UV light source, the super high pressure mercury lamp must be replaced frequently; and
(5) more electric power is consumed.

The exposure device during the manufacturing process of a printed circuit board (PCB) usually uses a concurrent exposure method in which a photosensitive material is exposed at one time by a mercury lamp using a film mask. Regarding the exposure of the PCB, the higher the packaging density at which components for the exposure device are packaged, the higher the accuracy and miniaturization with which the circuitry are patterned. However, since the mercury lamp uses the film mask, a problem is caused by film contraction due to a change of temperature and/or humidity and a change of temperature at the substrate side, thus making it difficult to obtain more accurate circuit patterning than in the exposure device of the current technology. If a glass mask is used instead of the film mask, a problem with the film contraction can be eliminated. However, the glass mask is expensive, and handling thereof is difficult.

During the manufacturing process of the PCB, mass production of various products using a small scale production scale or production of requested items (so-called on-demand production) has often been employed in recent years. However, the concurrent exposure method needs a lot of time to prepare the mask alignment exposure, thus resulting in being inappropriate for the on-demand production. Further, with the concurrent exposure method, dust or defects on the mask decrease yields. Moreover, the super high-pressure mercury lamp and the mask are needed for the mask alignment exposure so that the running costs increases. Since a strong demand for signals with higher frequency tends to result in a higher demand for reproducibility of the PCB patterning, performance tests must be conducted on trial substrates on the actual mass-production line in order to guarantee the performance. Thus, even the mass-production line has a high demand for an exposure device that does not rely on mask alignment exposure but can implement a flexible production.

Conventionally, the manufacturing process of a plasma display panel (PDP) has mainly used the exposure device by the proximity method described above. However, since the display size of the PDP is large, a problem is caused in that a mask size becomes larger, whereby the mask manufacture becomes more expensive. Further, since the plasma display has a high demand for the on-demand production, use of an appropriate exposure device for the on-demand production is needed. Moreover, in the same manner as the exposure for the liquid crystal display (LCD) or the printed circuit board (PCB), a problem is caused with the operating costs due to the mask alignment exposure.

Lately, as an exposure device for a printed circuit board or a plasma display panel, a laser scanning and exposing device has been put into practical use. The above-described problems of the mask alignment exposure can be solved by the laser scanning and exposing device. However, at present, the laser scanning and exposing device is hardly popular. This is because a conventional laser scanning and exposing device uses an argon laser of several watts as a light source. Therefore, the following problems occur:

(1) in order to obtain an exposure speed (productivity) equal to that of the mask aligning exposure device, use of a material to be exposed with high sensitivity becomes necessary;
(2) a gas laser itself is expensive, whereby the manufacturing and maintenance costs of the entire device become high;
(3) for a conventional material to be exposed, since the light source power is low, productivity is extremely low;
(4) an exposure device of a certain type has a light source whose wavelengths are 488 nm and 532 nm, within a visible wavelength region, whereby dark room work becomes necessary; and
(5) a special material to be exposed with high sensitivity and having sensitivity in a visible wavelength region is expensive, and has insufficient stability.

SUMMARY OF THE INVENTION

In view of the aforementioned facts, an object of the present invention is to provide an exposure device that operates at high speed and with high accuracy. In the exposure device, a photosensitive material that is sensitive to a predetermined wavelength region including a UV region can be directly scanned and exposed based on digital data. Another object of the present invention is to provide an exposure device which can be manufactured inexpensively, exhibits high productivity and does not use a special and/or expensive material to be exposed such as a so-called highly sensitive material.

In order to attain the above-described objects, an exposure device which comprises: a scanner which including a high-power laser light source for emitting a light beam within a predetermined wavelength region, which region includes a UV region, the scanner scanning and exposing, in a predetermined scanning direction, a photosensitive material that is sensitive to the predetermined wavelength region, using said light beam which is modulated in accordance with image data; and a conveyer which moves the scanner in a direction intersecting the predetermined scanning direction, relative to the photosensitive material; wherein the high-power laser light source comprises at least one of: a gallium nitride semiconductor laser; a semiconductor laser excitation solid-state laser in which a laser beam produced by exciting a solid-state laser crystal with a gallium nitride semiconductor laser is wavelength-converted by an optical wavelength-converting element, and emitted; a fiber laser or fiber amplifier in which a laser beam, produced by exciting a fiber with an infrared light-emitting semiconductor laser, is wavelength-converted by the optical wavelength-converting element, and emitted; and a fiber laser in which a laser beam, produced by exciting a fiber with a gallium nitride semiconductor laser is wavelength-converted by an optical wavelength-converting element, and emitted, and the high-power laser light source is continuously driven or pulse-driven.

In accordance with the present invention, the exposure device comprises an exposure portion which has a high-power laser light source which emits a light beam within a predetermined wavelength region including a UV region, and the high power emitting laser light source may comprise at least one of a gallium nitride semiconductor laser; a semiconductor laser excitation solid-state laser in which a laser beam produced by exciting a solid-state laser crystal with a gallium nitride semiconductor laser is wavelength-converted by an optical wavelength-converting element, and emitted; a fiber laser or fiber amplifier in which a laser beam, produced by exciting a fiber with an infrared light-emitting semiconductor laser, is wavelength-converted by the optical wavelength-converting element, and emitted; and a fiber laser in which a laser beam, produced by exciting a fiber with a gallium nitride semiconductor laser is wavelength-converted by an optical wavelength-converting element, and emitted.

These laser light sources are laser light sources which can output high power of a few dozenW, which was impossible with conventional light sources, and can be continuously driven and pulse-driven. Conventionally, it is difficult for the laser light sources that emit light beams within a predetermined wavelength region including a UV region to output higher power at less expense. Originally, laser light sources have not been used as a light source to expose a photoresist during the manufacturing process of liquid crystal color filters. However, using the above-described high-power laser light sources can provide an inexpensive exposure device at high speed and with high accuracy.

As described above, the exposure portion which has a high power emitting laser light source within a predetermined wavelength region including UV light exposes the photosensitive material which is sensitive to the predetermined wavelength region and scans the same in a predetermined scanning direction, with the light beam emitted from the high-power laser light source and modulated in accordance with the image data. And the conveyer moves the exposure portion with respect to the photosensitive material in the direction intersecting the predetermined scanning direction. Accordingly, mask alignment exposure becomes unnecessary, whereby an exposure device which can be manufactured inexpensively and which can expose at high speed and with high accuracy can be provided without using special and expensive materials to be exposed i.e., ones with high sensitivity.

In the above-described exposure device, by exposing the photosensitive material with the light beam within a predetermined wavelength region including a UV region, which is emitted from the high power light source and which is pulse-driven, thermal diffusion due to the irradiated light is prevented and exposure at high speed and with high accuracy is also enabled. Therefore, the shorter the pulse width of the pulse-driven laser light (i.e., time intervals between pulse peaks), the better. Namely, a suitable pulse width is preferably 1 psec to 100 nsec, and more preferably 1 psec to 300 psec. Besides the laser light sources described above can output higher power which was impossible with the conventional light sources, the laser light sources can oscillate in a short pulse picosecond order and can expose at high speed and with high accuracy. A predetermined wavelength region including a UV region is preferably 350 to 420 nm, and more preferably 405 nm at which a maximum power can be outputted by using an inexpensive gallium nitride semiconductor laser.

The above-described exposure device may comprise a plurality of the exposure portions. Each of the exposure portions can be moved independently or integrally relative to the photosensitive material. Multiple exposure portions are used to expose the photosensitive material, whereby the exposure can expose at higher speed.

It is preferable that the exposure portion comprises a spatial light modulator that is driven by an electric mechanical operation using electrostatic force to modulate a light beam. For example, the spatial light modulator may comprise a digital micromirror device (DMD manufactured by Texas Instrument Inc.) with movable miromirrors arranged therein or grating light valve elements of a reflective diffracting grating type (GLV elements manufactured by Silicon Light Machine Inc.). A description of the GLV element is given in U. S. Pat. No. 5,311,360 in more detail. Durability of the spatial light modulator of the reflective diffracting grating type with respect to a high power light beam within a predetermined wavelength region including a UV region is comparatively higher than a conventional transmissive spatial light modulator such as an optical element (PLZT element) for modulating transmitting light or a liquid crystal optical shutter (FLC). Even if the high-power laser light source outputting several tens of dozen watts, which type did not exist previously, is used due to continuous driving or pulse driving, such spatial light modulator can be used with high stability. Therefore, it is possible to improve reliability of the exposure device even when exposure is conducted by using the high-power laser light source. Further, since the high-power laser light source is pulse-driven, reliability of the exposure device is further improved.

It is particularly preferable that the spatial light modulator comprises grating light valve elements of a reflecting diffraction grating type. In the grating light valve elements, multiple fixed micro-elements each having a first reflecting surface formed thereon and multiple movable micro-elements each having a second reflecting surface formed thereon are alternately arranged on a substrate surface in a predetermined direction. When a voltage is applied to the movable micro-elements forming the first reflecting surface, and electrostatic force is applied thereto, the movable micro-elements move, a distance between the first reflecting surface and the second reflecting surface varies, and incident light is diffracted. During the non-application of electrostatic force, the first reflecting surface and the second reflecting surface may be either flush with each other or not. However, when electrostatic force is applied to the first reflecting surface and the second reflecting surface, the distance therebetween varies, another diffraction grating is formed, thereby allowing incident light to diffract in a predetermined direction. Then, the pairs of the fixed micro-element and the movable micro-element are made to correspond to single pixels. Electrostatic force is applied or not applied to each of the element pairs in accordance with image data. Accordingly, the photosensitive material can be exposed linearly. A flexible film material or configuration for structuring the grating light valve elements is optimized, whereby the object to be exposed is exposed at a low driving voltage (a few volts to a few dozen volts) and at an operational speed of a few dozen of nsec or less. Consequently, durability of the device improves, and exposure at higher speed is made possible.

When the grating light valve elements are used, the spatial light modulators can comprise, as the light modulator array, multiple grating light valve elements arranged in a row or rows in a direction substantially orthogonal to the predetermined direction. When the spatial light modulators are arranged in rows, they may be arranged in a staggered form, for example. In this case, it is preferable that the lengthwise direction of the lattice plate of each grating light valve element correspond to the direction in which the light modulator array is arranged.

The spatial light modulators may be arranged in a direction in which one spatial light modulator rotates axially around a normal line of the surface of each spatial light modulator at a predetermined angle with respect to the optical axis.

The laser light sources outputting high-power laser can use laser light sources described below. These laser light sources are continuously driven or pulse-driven and emit laser light within a predetermined wavelength range including a UV region (350 nm to 420 nm, preferably, 405 mn).
(1) a gallium nitride semiconductor laser.

For example, a gallium nitride semiconductor laser having a broad area light emitting region, a 10 mm long-bar type semiconductor laser, and a semiconductor laser comprising a gallium nitride semiconductor laser chip having a plurality of light emitting points can be used. Further, when an array type semiconductor laser described in Japanese Patent Application No. 2001-273849, higher output can be expected;
(2) a semiconductor laser excitation solid-state laser in which a laser beam obtained by excitation of a solid-state laser crystal by the gallium nitride semiconductor laser is wavelength-converted by an optical wavelength-converting element, and emitted, and examples thereof include: a solid-state laser crystal to which at least $Pr^{3+}$ is added as a rare-earth ion, a gallium nitride semiconductor laser for emitting a laser beam which excites the solid-state laser crystal, and a semiconductor laser excitation solid-state laser comprising an optical wavelength-converting element by which a wavelength of the laser beam obtained by excitation of the solid-state laser crystal is converted to UV light.
(3) a fiber laser in which a laser beam obtained by excitation of a fiber by the gallium nitride semiconductor laser is wavelength-converted by an optical wavelength-converting element, and emitted, and examples thereof include: a fiber which has a core in which at least one of $Er^{3+}$, $Ho^{3+}$, $Dy^{3+}$, $Eu^{3+}$, Sn3+, $Sm^{3+}$, and $Nd^{3+}$, and $Pr^{3+}$ are doped; a gallium nitride semiconductor laser for emitting a laser beam that excites the fiber; and a fiber laser comprising an optical wavelength-converting element by which a laser beam obtained by excitation of the fiber is wavelength-converted to a predetermined wavelength region including a UV region;

Each of $Er^{3+}$, $Ho^{3+}$, $Dy^{3+}$, $Eu^{3+}$, $Sn^{3+}$, $Sm^{3+}$, and $Nd^{3+}$ has an absorption band in wavelengths of 380 nm to 430 nm, and can be excited by the GaN semiconductor laser. Excited electrons are energy-shifted to an excited level of $Pr^{3+}$ and then transited to a lower level, and the fiber laser is enabled to oscillate in cyan, green, and magenta regions as oscillating lines of $Pr^{3+}$. The wavelengths of 380 to 430 nm are a wavelength region in which the GaN semiconductor laser is comparatively apt to oscillate. Since wavelengths of 400 to 410 nm are especially a wavelength region in which a maximum output of the GaN semiconductor laser is obtained, if $Er^{3+}$, $Ho^{3+}$, $Dy^{3+}$, $Eu^{3+}$, $Sn^{3+}$, $Sm^{3+}$, and $Nd^{3+}$ are excited by the GaN semiconductor laser, the amount in which the excited light is absorbed becomes larger, high efficiency and high power can be accomplished. Further, the number of optical components are reduced, the structure of the device is simplified, and loss due to excitation is minimized, whereby temperature stable region can be increased.

As a GaN semiconductor laser which is an excitation light source, besides a single row or column mode type of the GaN semiconductor can be used, one or more of other types such as broad area type, multi-array type, phased-array type, MOPA type GaN semiconductor lasers, and a high power fiber type GaN semiconductor laser in which the GaN semiconductor laser is multiplexed and coupled to a fiber can be used. A fiber laser can be used as the excitation light source. In this way, obtaining of higher power of W (watt) class is made possible by using such high power type GaN semiconductor lasers. When a laser is used in which $Pr^{3+}$ having a broad emitting spectrum is used and which has been described in the (2) and (3), psec pulse driving is facilitated by a mode lock, and operation at high repetitive rate is made possible. Further, due to psec oscillation, wavelength can be converted at high efficiency.
(4) a fiber laser or fiber amplifier in which a laser beam obtained by excitation of a fiber by an infrared light-emitting semiconductor laser is wavelength-converted by an optical wavelength-converting element, and emitted.

Examples thereof include: a fiber laser whose core is $Nd^{3+}$ doped, $Yb^{3+}$ doped, or $Er^{3+}$ and $Yb^{3+}$ doped; a semiconductor laser for emitting an infrared laser beam and exiting the fiber laser; and a fiber laser or fiber amplifier having an optical wavelength-converting element by which a laser beam obtained by excitation of the fiber is wavelength-converted to light within a predetermined wavelength region including a UV region. As the optical wavelength-converting element, a THG (third harmonics) element and an FHG (fourth harmonics) can be used.
(5) a laser comprising a gallium nitride semiconductor laser which is multiplexed to a fiber.

For example, as described in Japanese Patent Application Nos. 2001-273870 and 2001-273871, a plurality of the gallium nitride semicoiiductor lasers is multiplexed by an optical multiplexer so that high power can be outputted from the fiber. A fiber in which a semiconductor laser comprising a semiconductor laser chip for emitting a plurality of light beams is multiplexed by a condensing optical system can be used. Further, gallium nitride semiconductor beams having a broad area light-emitting region can be multiplexed to a fiber. Arranging these fibers in an array forms a linear light source or arranging these fibers in a bundle forms an area light source, whereby higher power can be outputted.

The light source may comprise multiple laser light sources and the multiplexing optical system for multiplexing the laser beams emitted from the multiple laser light sources. A laser light source can use one of the above-described (1) to (5) laser light sources. Multiplexing the laser beams emitted from the multiple laser light sources by using the multiplexing optical system enables light sources to output higher power.

The gallium nitride semiconductor laser, which is a semiconductor laser, can be manufactured inexpensively. Further, the gallium nitride semiconductor laser whose transition mobility is very low and whose heat conductivity coefficients are very high has an extremely high COD (Catastrophic Optical Damage) value. Further, the gallium nitride semiconductor laser, which is a semiconductor laser, can be pulse-driven and operated at high repetitive rate in short cycles of pulses having high peak power, whereby exposure at high speed and with high accuracy is made possible. Accordingly, use of the gallium nitride semiconductor laser as a light source enables an exposure unit to expose at less expense, at high speed, and with high accuracy.

Examples of the photosensitive material include: a photosensitive material for forming a liquid crystal color filter; a photoresist for manufacturing a printed circuit board, electrodes for plasma display; and a barrier; a fluorescence; a planographic printing plate; and an optical circuit board. The photosensitive materials can be held on a vertical flat stage or a horizontal flat stage to accomplish exposure with high accuracy in a state of being held on the vertical or horizontal flat stage. Further, these photosensitive materials can be used in an external drum method using a photosensitive cylinder or a cylinder having the photosensitve material coated thereon.

BRIEF DESCRIPTION OF THE DRAWINGS

FIG. 5 is a graph showing a transmissivity of a narrow band pass filter of the laser light source of FIG. 4;

FIG. 11A is a plan view of semiconductor laser chips in a light source;

FIG. 11B is a cross-sectional view taken along an optical axis of FIG. 11A;

FIG. 12 is a perspective view of a light source used in the third embodiment of the present invention;

FIG. 14 is a schematic cross-sectional view of an example of a layered structure of a GaN semiconductor laser having a broad area light-emitting region as a light source used for the exposure device according to the present invention;

FIGS. 23A and 23B are explanatory views of an operational state of the coherent spatial light modulator of FIG. 21;

DETAILED DESCRIPTION OF THE PREFERRED EMBODIMENT

With reference to the drawings, a detailed description of embodiments of the present invention will be given hereinafter.

First Embodiment

Figure 1:
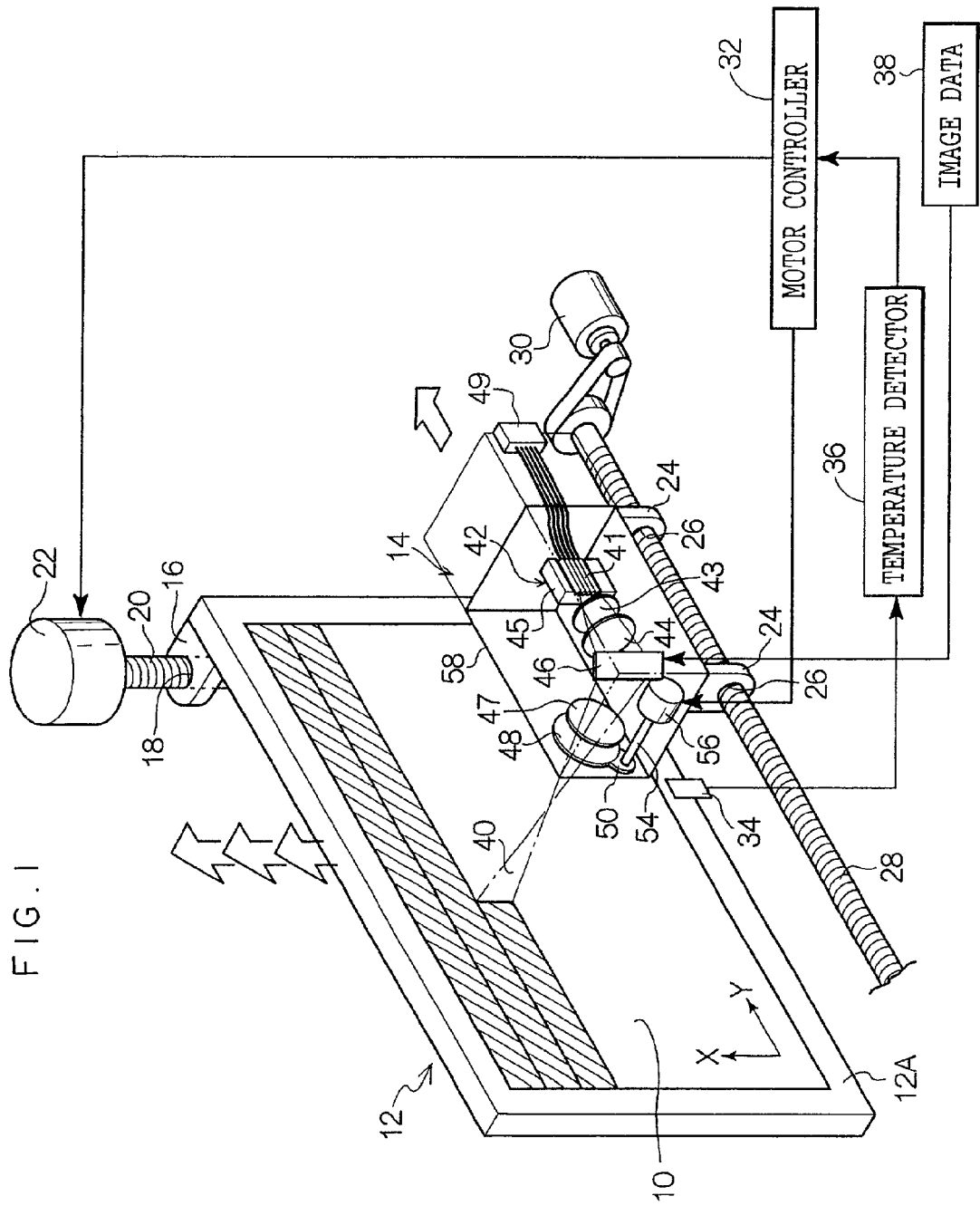
FIG. 1 is a perspective structural view of an exposure device according to a first embodiment of the present invention.

An embodiment of the present invention, in which an exposure device of the present invention has been applied to expose a photoresist during the manufacturing process of a liquid crystal color filter, will be described. As shown in FIG. 1, this exposure device comprises: a vertical flat stage 12 having an object to be exposed 10 adsorbed to a side surface thereof and held, and an exposure head 14, which exposes and scans the object to be exposed 10 with a laser light 40 that is modulated in accordance with image data 38. The flat stage 12 is supported by a guide (not shown) so as to be movable in X direction. The exposure head 14 is supported by another guide (not shown) so as to be movable in Y direction.

A nut 16 is fixed to each top and bottom positions of rear surface corner portions of the flat stage 12, and a lead screw 20 is screwed into internal threads 18 of the nuts 16. A driving motor 22 for rotating the lead screw 20 is mounted to one end portion of the lead screw 20. The driving motor 22 is connected to a motor controller 32. Then, in accordance with the rotation of the lead screw 20 due to the driving motor 22, the flat stage 12 moves step by step in X direction.

A pair of nuts 24 is fixed to a lower portion of the exposure head 14, and a lead screw 28 is screwed into internal threads 26 of the nuts 24. A driving motor 30 for rotating the lead screw 28 is coupled to one end portion of the lead screw 28 via a belt, and the driving motor 30 is connected to the motor controller 32. Then, in accordance with the rotation of the lead screw 28 due to the driving motor 30, the exposure head 14 moves back and forth in Y direction.

A temperature detector 34 is attached to a surface 12A to be exposed of the flat stage 12 to detect the temperature of the surface of the stage 12. The temperature detector 34 is connected to the motor controller 32 via a temperature detecting circuit 36. Rotations of the driving motor 22 and the driving motor 30 are controlled by the motor controller 32 on the basis of the temperature detected by the temperature detecting circuit 36.

Figure 2A:
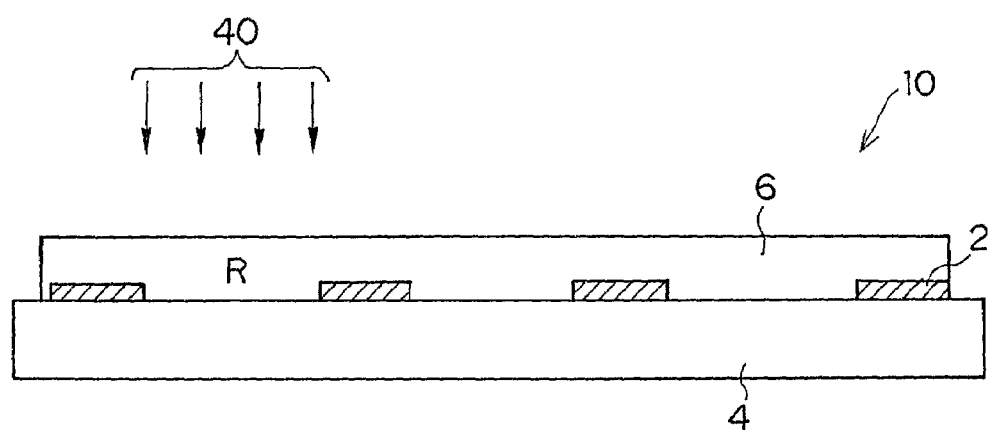
FIG. 2A is a cross-sectional view of an object to be exposed having a color resist film formed on a glass substrate.
Figure 2B:
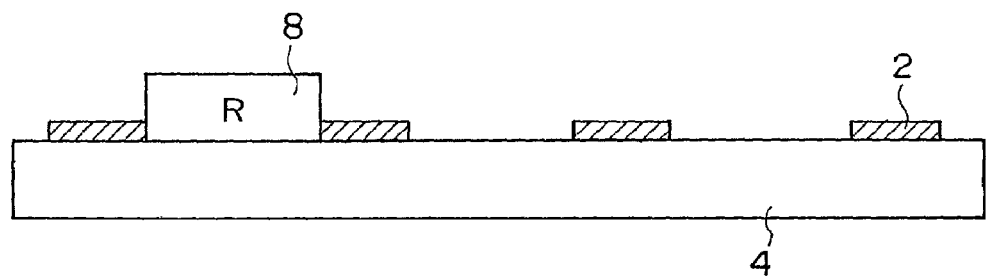
FIG. 2B is a cross-sectional view illustrating a state of FIG. 2A after exposure.

As shown in FIG. 2A, the object to be exposed 10 comprises a glass substrate 4, a color resist film 6, and a black matrix 2. In the object to be exposed 10, the color resist film 6 having, for example, an R-color pigment dispersed into a UV photo-curable resin is formed on the glass substrate 4 having the black matrix 2 formed thereon. As shown in FIG. 2B, when the object to be exposed 10 is irradiated with the laser light 40, only a portion of the color resist film 6, which portion was irradiated with the laser light 40, is cured to form an R-color filter portion 8 on the portion of the color resist film 6.

Figure 3:
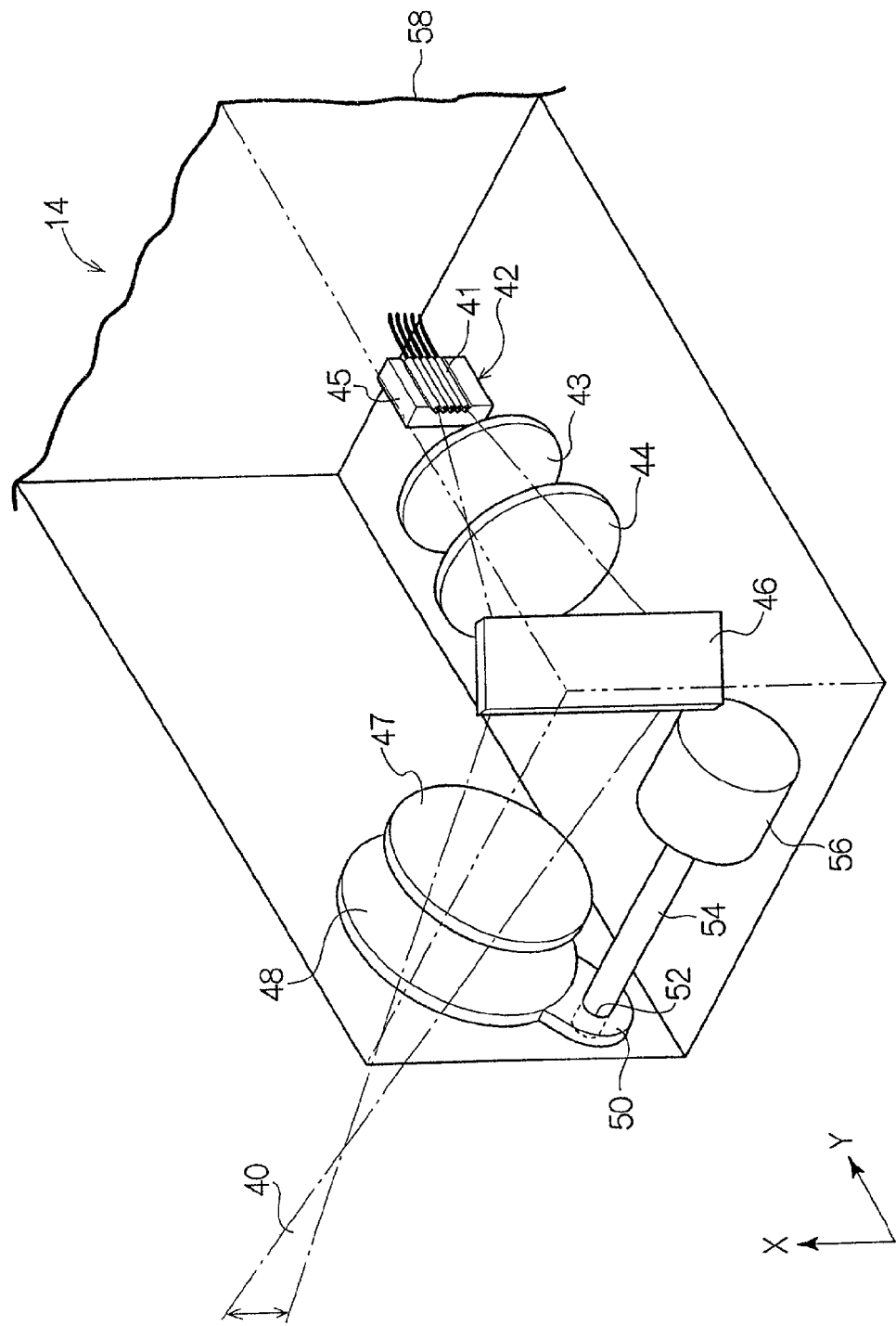
FIG. 3 is a perspective enlarged structural view of an exposure head of the exposure device shown in FIG. 1.

As shown in FIG. 3, the exposure head 14 comprises an exposure unit including: a laser light source 42, which outputs a high power; lenses 43 and 44, which converges an incident laser light from the laser light source 42 to a narrow linear optical flux in X direction; a light modulator array 46, which modulates the incident laser light for each pixel in accordance with the image data 38; and zoom lenses 47 and 48, which focus the laser light modulated by the light modulator array 46 onto the surface of the object to be exposed 10 by changing magnification of the laser light. Each of the members for comprising the exposure unit is housed in a casing 58. The laser light 40 emitted from the zoom lens 48 passes through an unillustrated opening disposed at the casing 58 and is irradiated onto the surface of the object to be exposed 10.

The laser light source 42 comprises: a laser portion 49 including semiconductor lasers; and a multimode fiber 41 which is optically coupled to each of the semiconductor lasers of the laser portion 49. A plurality of multimode fibers 41 (e.g. five fibers) is arranged in an array along a lengthwise direction of the light modulator array 46 so as to emit the laser light in a line along the lengthwise direction of the light modulator array element 46. A fiber holder 45 has a plurality of linear grooves formed parallel to each other in the direction in which beams are emitted. One of the multimode fibers 41 is held by each groove. A detailed description of the laser light source 42 will be given hereinafter.

A nut 50 is fixed to the outer circumferential portion of the zoom lens 48, and a lead screw 54 is screwed into internal threads 52 of the nut 50. A driving motor 56 for rotating the lead screw 54 is mounted to one end portion of the lead screw 54, and is also connected to the motor controller 32. Then, in accordance with the rotation of the lead screw 54 due to the driving motor 54, the zoom lens 48 is moved along the optical axis, and exposure magnification is controlled. Further, although a zoom lens ordinarily comprises a combination of lenses, only a single lens is shown in order to simplify the illustration.

The laser light source 42, the lenses 43 and 44, and the zoom lenses 47 and 48 are fixed to the casing 58 by fixing members (not shown). The zoom lens 48 is supported by a guide (not shown) so as to be movable in the direction of the optical axis. The laser light source 42 and the light modulator array 46 are respectively connected to a controller (not shown) and controlled by using a driver (not shown).

Figure 4A:
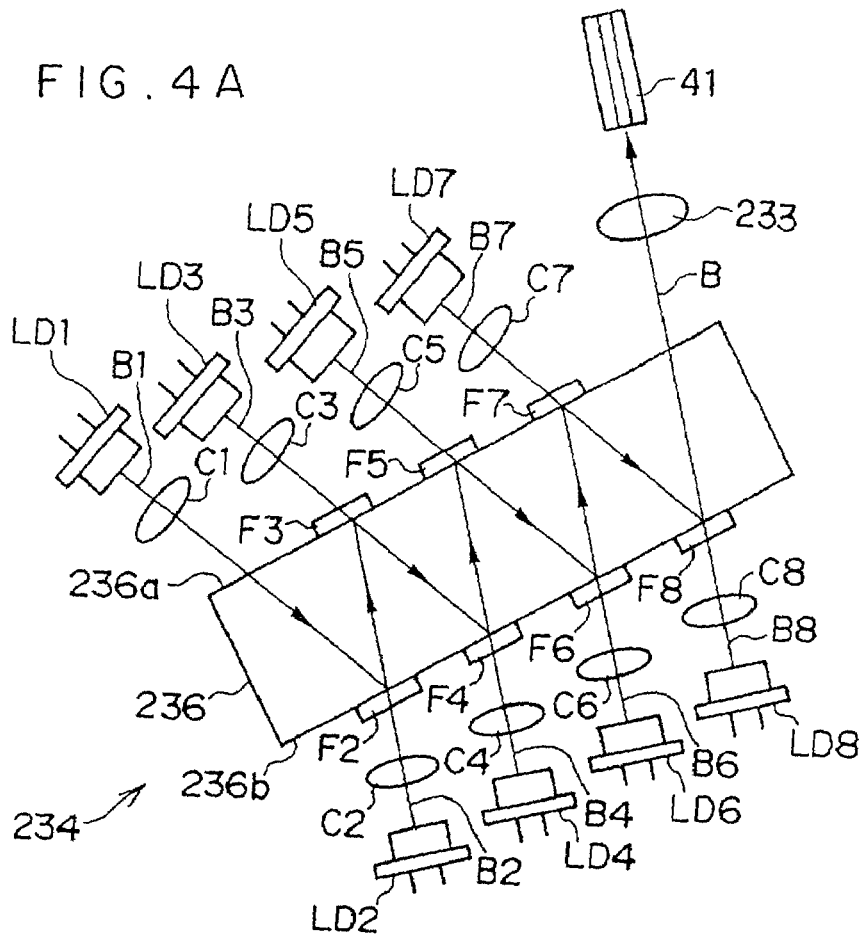
FIG. 4A is a flat structural view of a laser light source of the exposure device according to the first embodiment of the present invention.

The light source 42 can use a laser light source, for example, which is described in Japanese Patent Application No. 2001-273870 and in which mutimode gallium nitride (GaN) semiconductor lasers whose wavelengths are multiplexed to a fiber. As shown in FIG. 4A, this light source 42 comprises eight multimode gallium nitride (GaN) semiconductor lasers LD1, LD2, LD3, LD4, LD5, LD6, LD7 and LD8, and a multiplexing optical system 234. Oscillating wavelengths of the GaN semiconductor lasers LD1 to LD8 are within a range of 390 to 410 nm that enables wavelengths to oscillate and output high power, and have wavelengths of 395 nm, 396 nm, 397 nm, 398 nm, 399 nm, 400 nm, 401 nm, and 402 nm which are different from each other by 1 nm. Moreover, each laser commonly outputs 100 mW at this time.

Collimator lenses C1 to C8 are arranged so as to correspond to the GaN semiconductor lasers LD1 to LD8, and are responsible for making parallel laser beams B1 to B8 in a state of divergent lights each of which is emitted from the respective GaN semiconductor lasers LD1 to LD8.

The multiplexing optical system 234 comprises a parallel-plate prism 236, narrow band pass filters F3, F5, and F7 adhered to one surface 236a of the parallel-plate prism 236, and narrow band pass filters F2, F4, F6 and F8 adhered to the other surface of the parallel-plate prism 236. Each of the narrow band pass filter F2, F4, F6 and F8 reflects light that is emitted from an adhesive surface adhered to the surface 236a of the parallel-plate prism 236 at a reflectance of 98%, for example, and transmits light which exists within a region of a predetermined wavelength and which is emitted from the opposite side of the adhesive surface, at a transmittance of 90%. FIG. 5 shows a transmitting spectrum of the narrow band pass filters F2 to F8 in combination with a transmitting spectrum of a narrow band pass filter F1 that will be described later.

Figure 4B:
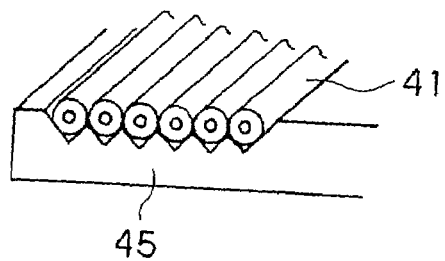
FIG. 4B is a plan view of end surfaces of fibers arranged in an array.

The GaN semiconductor lasers LD1 to LD8 are disposed in such a manner that the laser beams B1 to B8 emitted from GaN semiconductor lasers LD1 to LD8 enter the narrow band pass filters F2 to F8 at an incident angle of 5°, respectively. The laser beams B1 to B8 emitted from GaN semiconductor lasers LD1 to LD8 and having wavelengths of 395 nm, 396 nm, 397 nm, 398 nm, 399 nm, 400 nm, 401 nm, and 402 nm respectively enter the parallel-plate prism 36. Thereafter, the laser beams B1 to B8 are multiplexed to one single beam while being reflected by the narrow band pass filters F2 to F8, whereby the multiplexed laser beams B are emitted and the parallel-plate prism 236 can output high power (e.g. 0.5 W). The emitted laser beams B are condensed by a lens C9, and coupled to a multimode fiber 41 whose core diameter is about 10 μm and in which NA=0.3. As shown in FIG. 4B, by arranging the multimode fibers 41 so as to form the light emitting end surfaces thereof in an array, when 100 fibers are arranged in an array, linear beams outputting a power of 50 W can be obtained. Further, as shown in FIG. 1, the laser portion 49 comprising the GaN semiconductor lasers LD1 to LD8, the parallel-plate prism 236, and the lens 233 are housed in the casing 58 of the exposure head 14.

Figure 6:
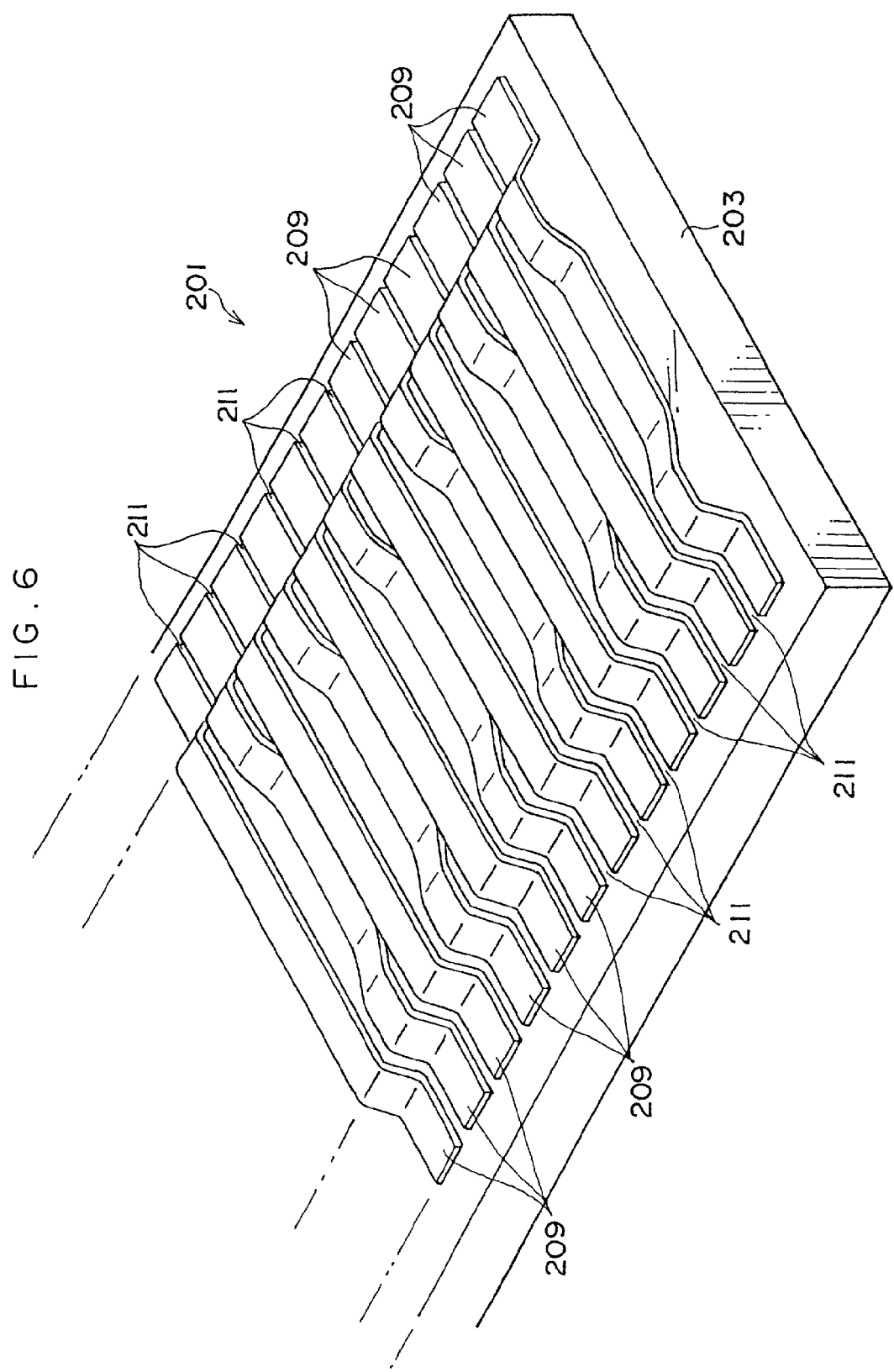
FIG. 6 is a perspective schematic structural view of a grating light valve element (GLV element) used as a light modulator array.
Figure 7A:
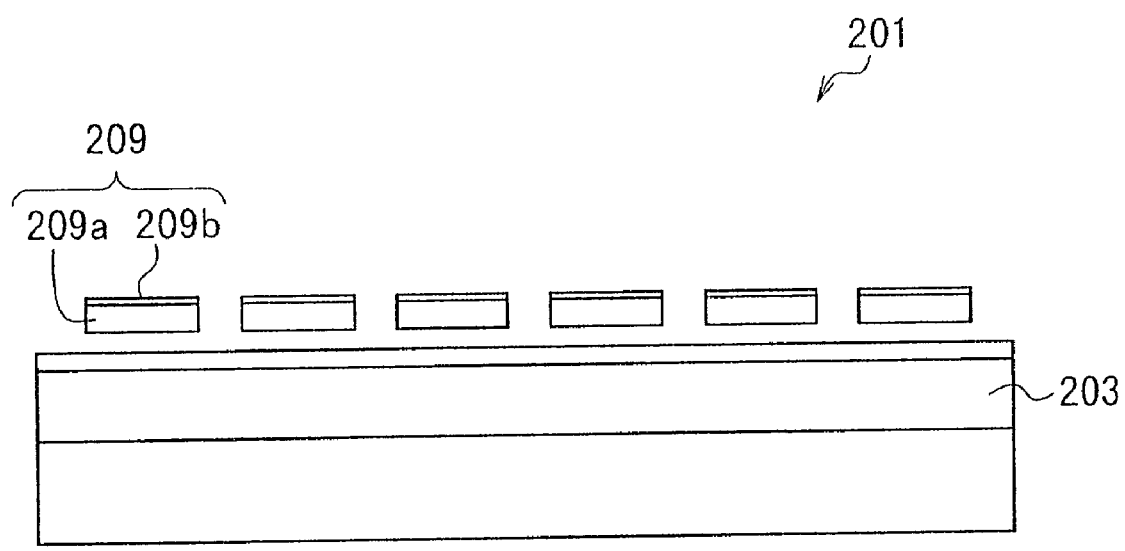
FIG. 7A is an explanatory view of an operational principle of the GLV element.
Figure 7B:
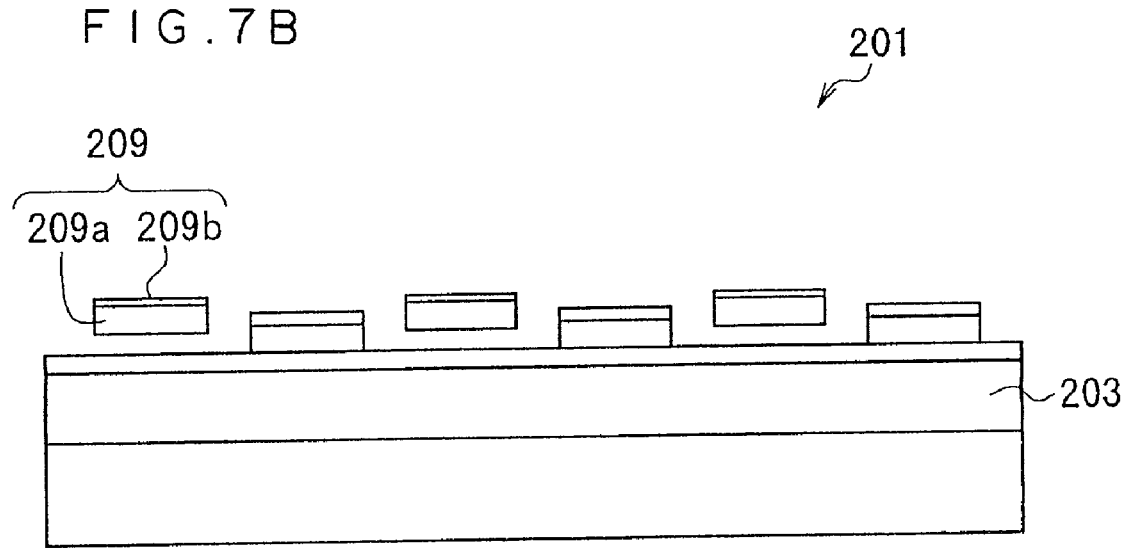
FIG. 7B is an explanatory view of the operational principle of the GLV element.

With reference to FIG. 6 and, FIGS. 7A and 7B, description of a structure and an operational principle of GLV (Grating Light Valve) elements used for the light modulator array 46 will be given hereinafter. As disclosed in U.S. Pat. No. 5,311,360, for example, GLV element 201 are spatial light modulators (SLM) of an MEMS (Micro Electro Mechanical Systems) type, and as shown in FIG. 6, are formed by gratings arranged in one direction.

As shown in FIG. 6, multiple ribbon type micro-bridges 209 (e.g. 6,480) are disposed on a substrate 203 which is made of silicon or the like, of the GLV element 201. A plurality of the micro-bridges 220 is arranged parallel to one another, whereby multiple slits 211 are formed. The microbridges 209 are separated from the substrate 203 at predetermined distances.

As shown in FIG. 7, the micro-bridge 209 at the bottom side that faces the substrate 203 is formed by a flexible beam 209a comprising SiNx or the like, while the one at the top side is formed by a reflective electrode layer 209b which is formed by a single metal layer of aluminum (or gold, silver, copper or the like). By forming the reflective electrode layer 209b by gold, silver or copper, reflectance can be improved for optical wavelengths to be used. The aforementioned substrate 203, the microbridges 209, and the unillustrated controller comprise a movable grating moving portion.

This GLV element 201 is driven and controlled by switching on/off of a voltage applied between the microbridges 209 and the substrate 203. When the voltage applied between the microbridges 209 and the substrate 203 is switched on, electrostatic attraction is generated therebetween, and the microbridges 209 flex towards the substrate 203. Meanwhile, the voltage applied between the micro-bridges 209 and the substrate 203 is switched off, the state in which the microbridges 209 have been flexed is cancelled, whereby the microbridges 209 separate from the substrate 203 due to ballistic return. Ordinarily, one pixel comprises a plurality of the microbridges 209 (six, for example). The microbridges 209 to which a voltage is to be applied are alternately arranged, gratings are thereby formed at the microbridges 209 upon the application of the voltage, and light modulation is carried out.

If the voltage is not applied to the microbridges 209, the reflecting surfaces of the microbridges 209 are entirely leveled, lengths of optical paths are the same, and light beams are normally reflected. On the other hand, when a voltage is applied to every one microbridge, the central portion of the microbridge 209 to which the voltage has been applied flexes in accordance with the above-described principle, whereby levels of the reflecting surfaces of the microbridges 209 alternately change. When laser beams are irradiated on such reflecting surfaces, since lengths of the optical paths are different at the light reflected from the microbridges 209 without flexure, optical grating phenomenon is generated. Intensity $I_{1st}$ of a primary grating light depends on an optical path difference, and can be expressed by the following equation. In this case, the intensity of grating light becomes the highest when the optical path difference is λ/2.

$$I_{1st} = I_{max} \sin\left(\frac{2\pi d}{\lambda}\right) \quad (1)$$

The GLV elements 201 according to the present embodiment are switched on/off via the driver (not shown) which is controlled by the above-described controller (not shown) so as to correspond to the inputted image data 38. Namely, incident light, when the GLV elements 201 are not being driven, is reflected at an angle of reflection that is identical to the angle of incidence, and becomes zero-order reflected light. The zero-order reflected light is deflected from the incident optical path of the zoom lens 48 using a slit plate, for example. However, the incident light, when the GLV elements 201 are driven, is reflected at a predetermined angle of diffraction. A primary reflected light of the diffracted light is incident upon the zoom lens 48. In other words, the GLV elements 201 are disposed so as to be inclined in advance by a predetermined angle (e.g. 45°) with respect to the optical axis of the lens 44 beforehand such that the primary reflected light of the diffracted light is incident on the zoom lens 48. Further, since the GLV elements 201 are formed on a silicon substrate, circuitry at control portions or the like can be formed on the same substrate. By forming the circuitry on the same substrate as described above, the exposure device can be made even more compact and lighter. Here, each of the electrodes, the controllers, and the drivers comprises the movable grating moving portion.

Description of an operation of the exposure device according to the first embodiment of the present invention will be given hereinafter.

In order to irradiate and expose the object to be exposed 10 with the laser light 40, the image data 38 is inputted from the controller (not shown) of the light modulator array 46, and temporarily stored in the frame memory of the controller. The image data 38 comprises data in which density of each pixel for forming image is represented by binary (by the presence of written dots).

The linear beam that is emitted from the laser light source 42 of the exposure head 14 and that extends in a lengthwise direction of the light modulator array 46 is irradiated linearly onto the elongated light modulator array 46 via the lenses 43 and 44, and then modulated at one time by the light modulator array 46. When the motor controller 32 causes the driving motor 56 to rotate at a fixed speed in accordance with the output from the temperature sensor 34, the lead screw 54 rotates at a fixed speed, and in accordance with the rotation of the lead screw 54, the zoom lens 48 moves along the optical axis. Therefore, exposure magnification of the zoom lens 48 in X direction is controlled, and the modulated laser light is linearly focused on the surface of the object to be exposed 10 in X direction via the zoom lenses 47 and 48. Exposure magnification of the zoom lens 48 in Y direction is controlled by an amount in which the lead screw 28 is rotated. Since exposure magnifications of the zoom lens 48 in X and Y directions are controlled on the basis of outputs from the temperature sensor 34, images of the same size can always be written on the object to be exposed 10 despite the change of temperature 10.

When exposure begins, the exposure head 14 is moved to a position where the exposure begins (original points in X and Y directions). When the motor controller 32 causes the driving motor 30 to rotate at a fixed speed, the lead screw 28 rotates at a fixed speed, and in accordance with the rotation of the lead screw 28, the exposure head 14 is moved in Y direction at a fixed speed.

In accordance with the movement of the exposure head 14 in Y direction a one line portion (i.e., a portion, the width of the subscanning direction being substantially equivalent with one step in X direction) of the image data 38 stored in the frame memory is read out sequentially in a number of pixel units substantially equal to the number of the GLV elements 201 of the light modulator array 46. Each of the GLV elements 201 of the light modulator array 46 is switched on/off in accordance with the read image data 38. Therefore, the laser light 40 emitted from the exposure head 14 is switched on/off. The object to be exposed 10 is exposed in X direction in a number of pixel units that substantially corresponds to the number of the GLV elements 201. The image data 38 is scanned and exposed by one line in Y direction (main-scan).

When the exposure head 14 reaches the end portion of the object to be exposed 10, the exposure head 14 returns to the original point in Y direction. Then, when the motor controller 32 causes the driving motor 22 to rotate at a fixed speed, the lead screw 20 rotates at a fixed speed, and in accordance with the rotation of the lead screw 20, the flat stage 12 is moved by one step in X direction (sub-scan). By repeating the main-scan and the sub-scan described above, the object to be exposed 10 is imagewise-exposed. Further, in the above-example the exposure head 14 is returned to the original point, and exposes the object to be exposed only on a forwarding path of the exposure head 14. However, the object is to be exposed 10 can also be exposed on a backward path. Thus, exposure time can further be reduced.

As described above, since the exposure device of the present embodiment uses a high-power laser light source, in accordance with the image data, the device can directly scan and expose the object to be exposed that is sensitive to a predetermined wavelength region including a UV region. Accordingly, as compared to an exposure device using the mask alignment exposure in the proximity method, the exposure device of the present invention is advantageous in that:

(1) since masks are not needed, manufacturing costs or time can be reduced, productivity can be improved, and the device is made suitable for the manufacture of various products at low-volume production;

(2) the object to be exposed is scanned and exposed directly in accordance with digital data, and data can be corrected as needed. Therefore, a holding mechanism with high accuracy, an alignment mechanism with high accuracy, and a temperature stabilizing mechanism with high accuracy become unnecessary. Consequently, the device can be manufactured at low cost, and operate at higher speed and with higher accuracy;

(3) the laser light source can be manufactured inexpensively and has higher durability as compared to the super high-pressure mercury lamp, whereby the running cost of the device can be reduced;

(4) the laser light source can be driven at a low driving voltage with less electric power consumption;

(5) image data can be recorded not only on a material that is sensitive to a UV region but also on a heat mode material; and (6) especially when the GaN semiconductor laser is used, a predetermined reaction can be finished, using short pulse exposure, before the material is thermally affected by a short pulse exposure, and rendering with higher accuracy (a so-called sharp image rendering) is made possible.

Due to the use of the spatial light modulator of the reflecting diffraction grating type, the amount of incident light which is adsorbed can be reduced significantly more than in a conventional structure in which an optical element (PLZT element) or a liquid crystal light shutter (FLC) for modulating transmissive light is used. Therefore, durability of the exposure device with respect to laser light can increase. In particular, the pulse-driven laser light source exhibits remarkably improved durability. Consequently, when the object to be exposed is exposed by using a high-power laser as a light source, reliability of the exposure device can be improved a great deal. Further, in light shutters using deflecting elements such as the PLZT elements, deflection degree of the laser light and positioning accuracy of the deflected elements are essential to restrict the selection and the optical design of laser elements. However, since the spatial light modulator of the reflecting diffraction grating type has no fundamental limitations on deflection, freedom in designing the laser elements can increase. Further, the GLV elements, which are also referred to as diffraction grating optical valves, are driven by an electrical mechanical operation using electrostatic force. Optimization of the quality or configuration of the flexible thin film can increase the operation speed of the device to a few dozen (nsec) at a low driving voltage (a few volts to a few dozen volts). In addition to the merit described above that durability of the device with respect to the laser light can be improved, the object to be exposed can be exposed at higher speed.

The structure and principle of the light modulator (the GLV elements) of the reflecting diffraction grating type that has been described in the present embodiment are introduced herein as an example. Therefore, the light modulator may be structured in any manner if the reflected light is controlled on/off in a predetermined direction due to diffraction effects.

Second Embodiment

Figure 8:
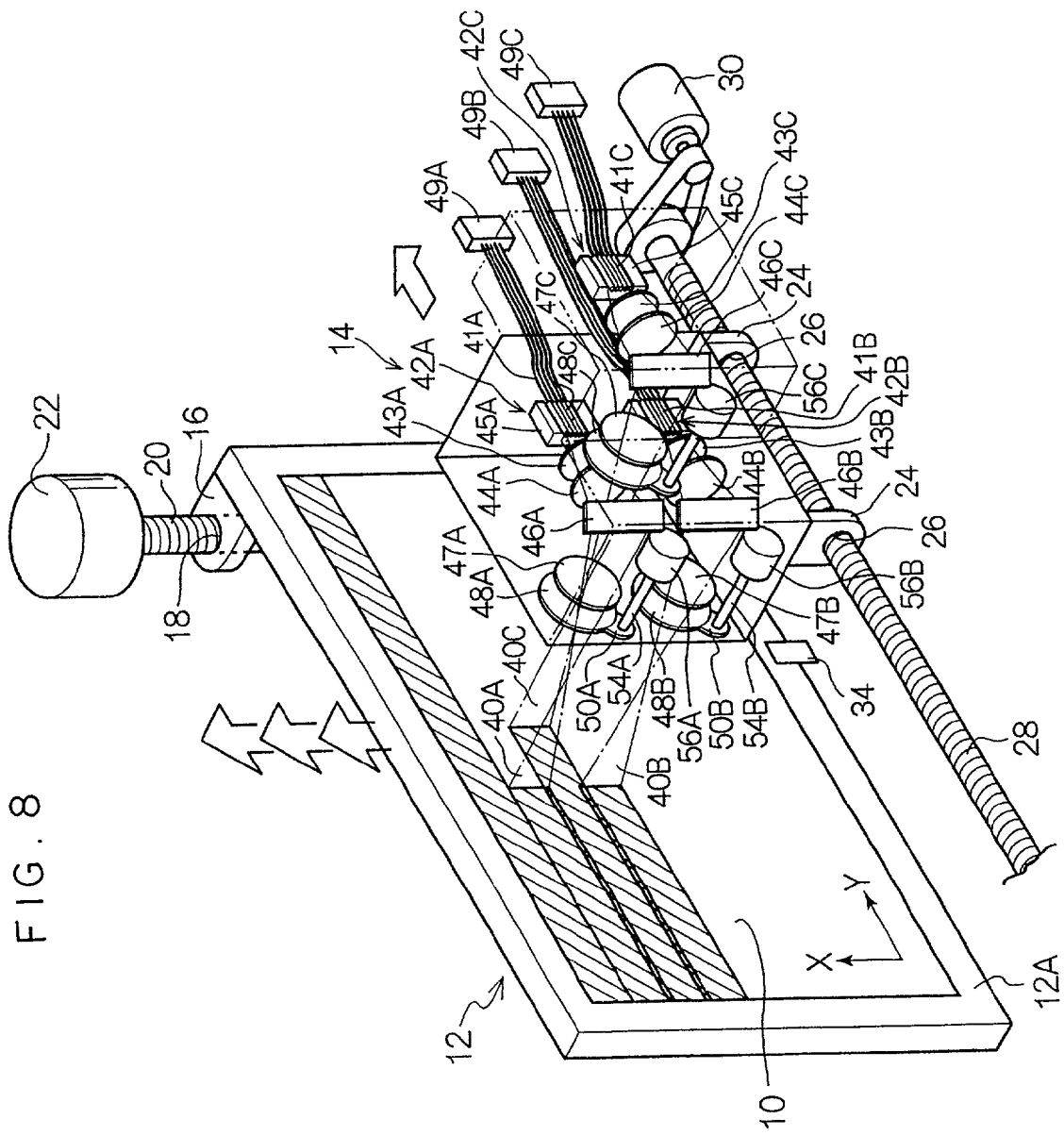
FIG. 8 is a perspective schematic structural view of an exposure device according to a second embodiment of the present invention.

As shown in FIG. 8, an exposure device according to a second embodiment of the present invention comprises an exposure head having multiple laser light sources, and is structured in a manner similar to the first embodiment of the present invention except that multiple laser lights are irradiated to expose the object to be exposed. Accordingly, portions identical to those in the first embodiment of the present invention are denoted by the same reference numerals and descriptions thereof will be omitted.

In this exposure device, an exposure unit A, an exposure unit B, and an exposure unit C are mounted at the exposure head 14. The exposure unit A comprises a laser light source 42A, lenses 43A and 44A, a light modulator array 46A, zoom lenses 47A and 48B, and a laser portion 49A. The exposure unit B comprises a laser light source 42B, lenses 43B and 44B, alight modulator array 46B, zoom lenses 47B and 48B, and a laser portion 49B. The exposure unit C comprises a laser light source 42C, lenses 43C and 44C, a light modulator array 46C, zoom lenses 47C and 48C, and a laser portion 49C.

The three exposure units A, B and C are housed in the casing 58. The exposure unit A is disposed above the exposure unit B. The exposure unit C is disposed in the rear and located at a position half way between the exposure unit A and the exposure unit B such that positions of the three exposure units are staggered. With each of the exposure units thus arranged in a staggered form, a work distance for the optical system can be secured.

The laser light 40A emitted from the zoom lens 48A, the laser light 40B emitted from the zoom lens 48B, and the laser light 40C emitted from the zoom lens 48C are irradiated onto the surface of the object to be exposed 10 through openings (not shown). The openings are formed at the casing 58 so as to correspond to the exposure units, respectively.

In the exposure unit A, a nut 50A is fixed to the outer circumferential edge portion of the zoom lens 48A, and a lead screw 54A is screwed into an internal thread portion 52A of the nut 50A. A driving motor 56A is mounted to an end portion of the lead screw 54A so as to rotate the lead screw 54A, and the driving motor 56A is connected to the motor controller 32. In accordance with the rotation of the lead screw 54A by the driving motor 56A, the zoom lens 48A is moved along the optical axis to control exposure magnification.

The exposure unit B and the exposure unit C are structured in the same manner as the exposure unit A. The zoom lenses 48B and 48C operate in the same manner as the zoom lens 48A of the exposure unit A.

Members for structuring the three exposure units are respectively fixed to the casing 58 by fixing members (not shown). Each of the zoom lenses 48A, 48B and 48C is supported so as to be movable along the optical axis. Further, the laser light sources 42A, 42B, and 42C, the light modulator arrays 46A, 46B and 46C are respectively connected to unillustrated controllers. The controllers control the laser light sources 42A, 42B, and 42C and the light modulator arrays 46A, 46B and 46C via unillustrated drivers.

Description of an operation of the exposure device according to the present embodiment will be given hereinafter.

In order to irradiate the laser lights 40A, 40B, and 40C onto the object to be exposed 10, image data (not shown) are inputted to each of the controllers (not shown) of the light modulator arrays 46A, 46B and 46C, and temporarily stored in frame memories of the controllers.

The linear beam which is emitted from the laser light source 42A of the exposure head 14 and which extends in a lengthwise direction of the light modulator array 46A is linearly irradiated on the elongated light modulator array 46A via the lenses 43A and 44A, and modulated at one time by the light modulator array 46A. When the motor controller 32 causes the driving motor 56A to rotate at a fixed speed in accordance with an output from the temperature sensor 34, the lead screw 54A rotates at a fixed speed, and in accordance with the rotation of the lead screw 54A, the zoom lens 48A is moved along the optical axis. Therefore, exposure magnification of the zoom lens 48 in X direction is controlled, and the modulated laser light is linearly focused on the surface of the object to be exposed 10 in X direction, through the zoom lenses 47A and 48A. Further, exposure magnification of the zoom lens 48 in Y direction is controlled by an amount in which the lead screw 28 is fed.

In a manner similar to the above-description, the laser light emitted from the laser light source 42B of the exposure head 14 is modulated by the light modulator array 46B, exposure magnifications of the zoom lens 48B in X and Y directions are controlled, and the modulated laser light is focused on the surface of the object to be exposed, through the zoom lenses 47B and 48B. Similarly, the laser light emitted from the laser light source 42C of the exposure head 14 is modulated by the light modulator array 46C, exposure magnifications of the zoom lens 48C in X and Y directions are controlled, and the modulated laser light is focused on the surface of the object to be exposed, through the zoom lenses 47C and 48C.

At the beginning of exposure, the exposure head 14 moves to a position at which the exposure head 14 begins to expose (original points in X and Y directions). When the motor controller 32 causes the driving motor 30 to rotate at a fixed speed, the lead screw 28 also rotates at a fixed speed, and in accordance with the rotation of the lead screw 28, the exposure head 14 moves in Y direction at a fixed speed.

In accordance with the movement of the exposure head 14 in Y direction, one line portion of the image data stored in the frame memory is read out for each of the exposure units sequentially in a number of pixel units that substantially corresponds to the number of the GLV elements 201 of each of the light modulator arrays 46A, 46B and 46C. In accordance with the read image data, the GLV elements 201 of each of the light modulator arrays 46A, 46B and 46C are switched on/off. Therefore, the laser lights 40A, 40B and 40C emitted from the exposure head 14 are respectively switched on/off. The object to be exposed 10 is exposed in X direction in pixel units that substantially correspond to the number of the GLV elements 201, and scanned and exposed by one line in Y direction. Namely, the object to be exposed 10 is scanned and exposed by three lines at one time in Y direction (main-scan).

When the exposure head 14 reaches the end portion of the object to be exposed 10, the exposure head 14 returns to the original point in Y direction. When the motor controller 32 causes the driving motor 22 to rotate at a fixed speed, the lead screw 20 rotates at a fixed speed, and in accordance with the rotation of the lead screw 20, the flat stage 12 moves by two steps in X direction (sub-scan). By repeating the main-scanning and sub-scanning operations described above, the object to be exposed 10 is imagewise-exposed. Further, in order to reduce the exposure time, the object to be exposed can be exposed not only on the backward path but also on the forward path.

As described above, in a manner similar to the first embodiment of the present invention, since the exposure device according to the present embodiment uses a high-power laser light source, the object to be exposed that is sensitive to a predetermined wavelength region including a UV region can be directly scanned and exposed on the basis of digital data. Accordingly, the device of the present embodiment is more advantageous in respect of the reasons (1) to (6) described above than an exposure device for conducting mask alignment exposure such as the exposure device using the proximity method.

Further, by using the exposure head having multiple laser light sources, multiple laser lights can be irradiated at one time to expose the object to be exposed. Accordingly, exposure at a speed higher than in the first embodiment of the present invention is made possible. For example, as in the present embodiment, in which three exposure units are mounted at the exposure head, exposure can be conducted at a speed about three times higher than for an embodiment comprising one single exposure unit. Moreover, even if one of the exposure units is non-functional, another unit can be used to continue exposure, whereby the exposure device of the present embodiment has excellent usage stability the second embodiment of the present invention, an example in which three exposure units are provided has been described. However, the number of exposure units is appropriately decided based on a size of the object to be exposed, desired exposure speed or exposure accuracy, and the like. Further, in the above-description, an example in which multiple exposure units are moved integrally with one another has been described. However, an exposure head can be disposed for each of the exposure units to move multiple exposure units independently.

Third Embodiment

Figure 9:
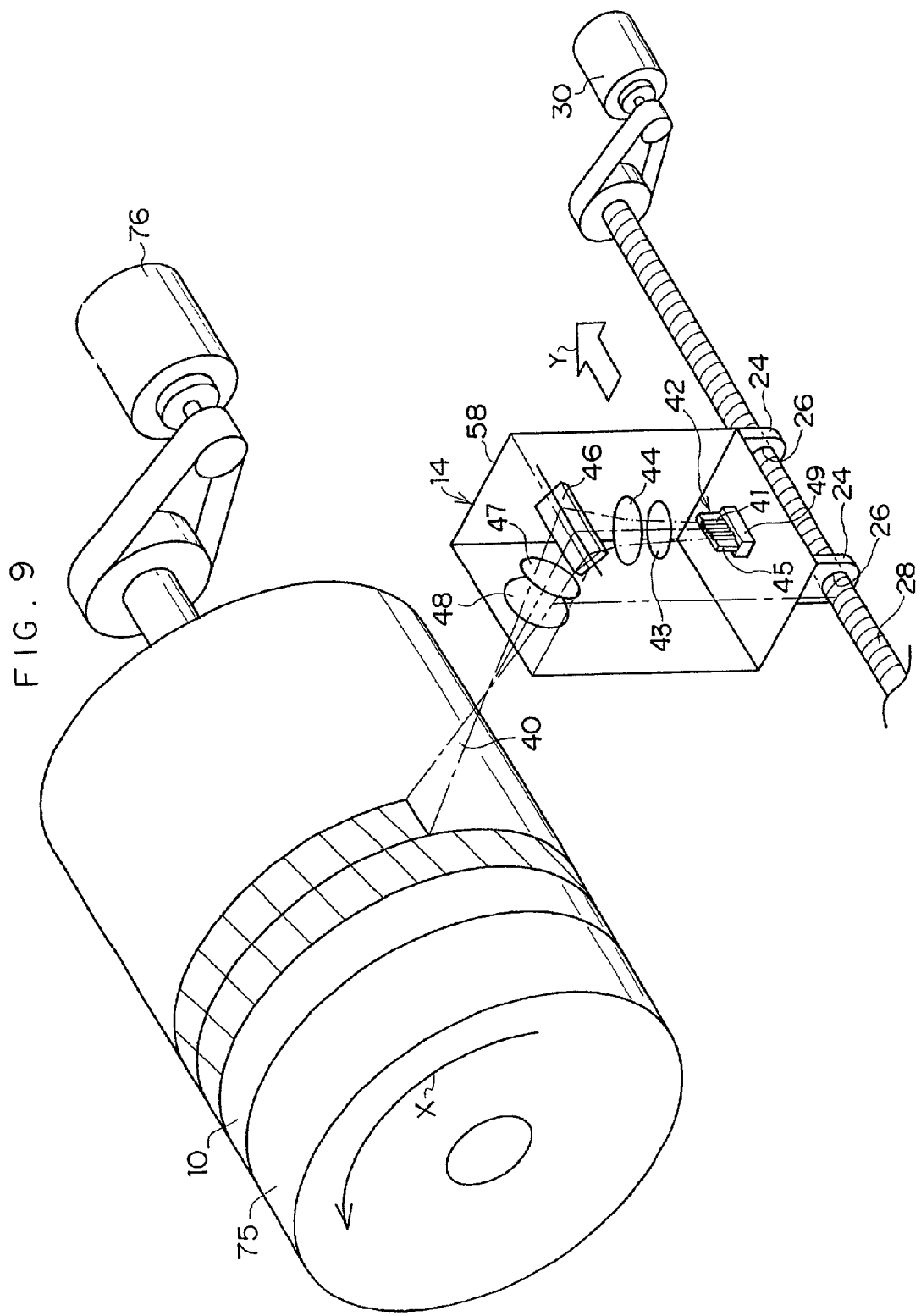
FIG. 9 is a perspective schematic structural view of an exposure device according to a third embodiment of the present invention.

In the first and second embodiments of the present invention, an example has been described in which the exposure device of the present invention is applied to the exposure of a photoresist during the manufacturing process of the liquid crystal color filter to thereby expose the object to be exposed held at a side surface of the vertical flat stage. However, in an exposure device according to a third embodiment of the present invention, as shown in FIG. 9, the object to be exposed 10 is wrapped around a rotating drum and held and then exposed. Accordingly, a flexible material is used as the object to be exposed 10. Further, portions identical to those of the exposure device according to the first embodiment of the present invention are denoted by the same reference numerals, and descriptions thereof will be omitted.

As shown in FIG. 9, this exposure device comprises a rotating drum 75 which is axially supported so as to be rotatable in the direction of arrow X and an outer circumferential surface, to which the object to be exposed 10 is adsorbed and held, and the exposure head 14, which scans and exposes the object to be exposed 10 with the laser light 40 that is modulated in accordance with the image data 38. The exposure head 14 is supported by an unillustrated guide so as to be movable in the direction of arrow Y.

A driving motor 76 for rotating the rotating drum 75 is connected to one end portion of a supporting axis of the rotating drum 75 via a belt. The driving motor 76 is connected to the motor controller 32. Due to the rotation of the supporting axis by the driving motor 76, the rotating drum 75 rotates in the direction of arrow X.

A pair of the nuts 24 is fixed to a lower portion of the exposure head 14, and the lead screw 28 is screwed into the internal thread portions 26 of each nut 24. The driving motor 30 for rotating the lead screw 28 is coupled to an end portion of the lead screw 28 via a belt. The driving motor 30 is connected to the motor controller 32. Then, in accordance with the rotation of the lead screw 28 due to the driving motor 30, the exposure head 14 moves back and forth in the direction of arrow Y.

As shown in FIG. 9, the exposure head 14 comprises an exposure unit. The exposure unit includes: the high-power laser light source 42; the lenses 43 and 44, which are arranged above the laser light source 42, for converging the incident laser light from the laser light source 42 to a narrow linear optical flux in the direction of arrow Y; the light modulator array 46 in which the incident laser light is modulated for each pixel in accordance with the image data 38; and the zoom lenses 47 and 48 which focus the laser light modulated by the light modulator array 46 on the surface of the object to be exposed 10. Each member for structuring the exposure unit is accommodated in the casing 58. The laser light 40 emitted from the zoom lens 48 is irradiated on the surface of the object to be exposed 10 through an unillustrated opening formed at the casing 58.

The laser light source 42, the lenses 43 and 44, the light modulator array 46, and the zoom lenses 47 and 48 are fixed to the casing 58 by the fixing members (not shown). The zoom lens 48 is supported by the guide (not shown) so as to be movable along the optical axis. The light modulator array 46 is arranged such that a direction in which the GLV elements are arranged is made parallel to the direction of arrow Y in FIG. 9. Namely, the light modulator array 46 is arranged such that the lengthwise direction of the array 46 and the direction of arrow Y are parallel to each other. Further, the laser light source 42 and the light modulator array 46 are respectively connected to the controller (not shown) for controlling the same via the driver (not shown).

The light source 42 can use those described in Japanese Patent Application Nos. 2001-273870 and 2001-273871. As shown in FIG. 12, the light source 42 comprises multiplexing modules 520 for multiplexing light beams emitted from multiple semiconductor laser chips to one single fiber, and the optical fiber 41 which is optically coupled to the multiplexing modules 520 and which is arranged in an array so as to emit a linear laser luminous flux. Namely, outputting end portions of the multiple optical fibers 41 are bundled in an array.

Figure 10:
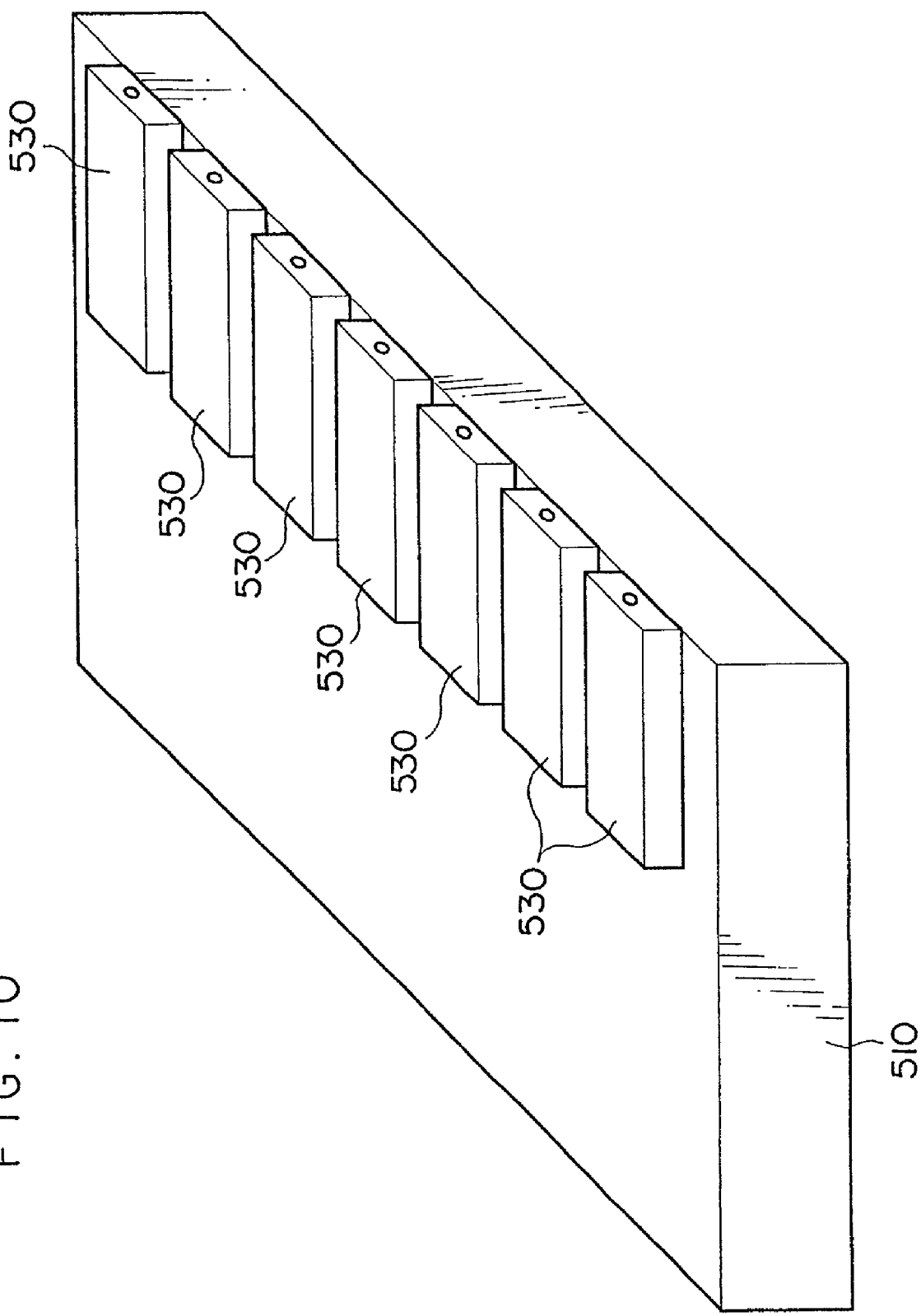
FIG. 10 is a perspective view of semiconductor laser chips at a light source.

As shown in FIG. 10, and FIGS. 11A and 11B, each of the multiplexing modules 520 comprises: a plurality of (e.g. seven) transverse multimode gallium nitride semiconductor lasers 530 which are fixedly arranged on a heat sink block 510 (formed by copper, for example); collimator lenses 540 which are provided so as to face each of the semiconductor lasers; and a condensing lens 550. Each multiplexing module 520 is optically coupled to one multimode optical fiber 41.

The heat sink block 510, the semiconductor laser 530, the collimator lens 540, and the condensing lens 550 are accommodated in a box-shaped package 580 whose upper portion is opened, and hermetically enclosed within a closed space structured by the package 580 and a package cap 581 by the opening of the package 580 closed by the package cap 581.

A base plate 590 is fixed to the bottom surface of the package 580, the heat sink block 510 is mounted on the top surface of the base plate 590, and a collimator lens holder 541 for holding the collimator lenses 540 is fixed to the heat sink block 510. Further, a condensing lens holder 551 for holding the condensing lens 550 and a fiber holder 552 for holding an incident end portion of the multimode optical fiber 41 are fixed to the top surface of the base plate 590. Wirings 555 for supplying a driving current into the gallium nitride semiconductor lasers 530 are drawn out of the package 580, through the wirings 555 which are enclosed by a hermetically sealing material (not shown) formed at a side wall surface of the package 580.

An aperture of each of the collimator lenses 540 in a direction in which the light emitting points of the gallium nitride semiconductor lasers 530 are arranged is formed smaller (namely, in an elongated shape) than that in a direction orthogonal to the direction in which the light emitting points of the gallium nitride semiconductor lasers 530 are arranged (in a vertical direction of FIG. 11), whereby the collimator lenses 540 are arranged close to the direction in which the light emitting points are arranged. Examples of the gallium nitride semiconductor lasers 530 include the ones which emit a laser beam whose light emitting width is 2 µm, and whose angles spread in a direction parallel to an active layer and in a direction orthogonal to the active layer are 10° and 30°, respectively.

Accordingly, the laser beam emitted from each light emitting point enters the collimator lens 540 such that a direction in which the spread angle of the light beam becomes maximum corresponds to a direction in which the aperture of the collimator lens 540 is the largest, and a direction in which the spread angle of the light beam becomes minimum corresponds to a direction in which the aperture of the collimator lens 540 is the smallest. Namely, the elongated collimator lens 540 is made to correspond to an elliptical cross-sectional configuration of the incident laser beam in order to minimize non-working portions thereof.

For example, in the present embodiment, the collimator lens 540 can be used in which a horizontal aperture is 1.1 mm, a vertical aperture is 4.6 mm, a focal length is 3 mm, and an NA is 0.6, and a laser beam entering the collimator lens 540 has a horizontal beam diameter of 0.9 mm, and a vertical beam diameter of 2.6 mm. Further, the collimator lenses 540 are arranged at a pitch of 1.25 mm.

The condensing lens 550 is formed in a rectangular shape whose lengthwise direction corresponds to a direction in which the collimator lenses 540 are arranged i.e., a horizontal direction, and whose widthwise direction corresponds to a direction orthogonal thereto. The condensing lens 550 having a focal length of 12.5 mm and an NA of 0.3 can be used. The condensing lens 550 is formed by molding resin or optical glass.

Examples of the multimode optical fiber 41 can include an optical fiber whose core central portion is a graded index type based on the one (manufactured by Mitsubishi Cable Industries, Ltd.) and whose outer peripheral portion is an step index type, which has a core diameter of 25 µm, an NA of 0.3, and a transmittance of end surface coating is 99.5% or more. Namely, the value of core diameter and NA is 7.5 µm.

When a coupling rate of the laser beam to the multimode optical fiber 41 is 0.9, the output of the gallium nitride semiconductor laser 530 is 100 mW, and the number of the semiconductor laser 530 is seven, multiplexed laser beam having an output of 630 mW (=100 mW×0.9×7) can be obtained.

The oscillating wavelengths of the gallium nitride semiconductor lasers 530 are 405±10 nm, and the maximum output thereof is 100 mW. The laser beams emitted from these gallium nitride semiconductor lasers 530 are made parallel by the corresponding collimator lenses 540 to the gallium nitride semiconductor lasers 530. The laser beams made parallel are condensed by the condensing lens 550, and converged onto the incident end surface of the core of the multimode optical fiber 41.

The condensing optical system is structured by the collimator lenses 540 and the condensing lens 550, and the multiplexing optical system is structured by the multimode optical fiber 41 in combination with the collimator lenses 540 and the condensing lens 550. Namely, the laser beam, which has been condensed as described above by the condensing lens 20, enters the core of the multimode optical fiber 41, propagates therethrough, is coupled with one single laser beam, and then emits from the multimode optical fiber 41. When the multimode optical fiber 41 of the step index type is used or when the multimode optical fiber 41 having a micro size core and having high NA is used, a graded index type thereof and a composite type thereof can be applied.

Instead of the respective collimator lenses 540 corresponding to each of the semiconductor lasers 530, a collimator lens array can be used which has the number of lens elements corresponding to that of the semiconductor lasers 530. The use of the collimator lens array allows for more spatial availability than that of the respective collimator lenses 540 which are arranged to be kept closely in contact with each other and in which the gallium nitride semiconductor lasers 530 are disposed at a narrow pitch. An effect can be obtained in that, due to such an increase of the spatial availability, the number of the multiplexers can be increased, and positioning accuracy with which the gallium nitride semiconductor lasers 530, the condensing optical system, and the multimode optical fiber 41 are assembled can comparatively be reduced.

A focal length and an NA (numerical aperture) of each lens element of the collimator lens array or the respective collimator lenses 540 are $f_1$, $NA_1$, a focal lens of the condensing lens 550 is $f_2$, an NA of the multimode optical fiber 41 is $NA_2$, and spatial availability is $\eta$. The spatial availability $\eta$ is determined by a ratio of a space occupied by optical paths of laser beams to a space occupied by the laser beams, and a state in which the optical paths of the laser beams are kept in tight contact with one another is $\eta=1$.

Under the aforementioned conditions, a magnification $\alpha$ of a lens diameter i.e., a ratio of a beam spot diameter on a core end surface of the multimode fiber 41 to a beam spot diameter at each of the emitting points of the gallium nitride semiconductor lasers is represented by the following equation (1) wherein N is the number of the multiplexers:

$$\alpha = \frac{f_2}{f_1} = \frac{NA_1}{\left(\frac{NA_2}{N} \times \eta\right)} = \frac{NA_1}{NA_2} \times \frac{N}{\eta} \qquad (2)$$

As is apparent from the equation (2), the larger the spatial availability $\eta$, the lower the magnification a. And, the smaller the magnification a, the smaller the distance laser beams move on a core end surface of the multimode optical fiber 41 when the gallium nitride semiconductor laser, the condensing optical system, and the multimode optical fiber are shifted from one another. Accordingly, the laser beams can normally enter the core of the multimode optical fiber 41 even if the gallium nitride semiconductor lasers, the condensing optical system, and the multimode optical fiber 41 are assembled with a comparatively low positioning accuracy. When $\eta$ approaches 1, the magnification a decrease, whereby the number of multiplexers N can be increased by the decreased amount of a. Accordingly, even when the number of the multiplexers N is increased, laser beams can output a high power at high misregisration tolerance.

The fiber 41 provided for each of a multiple number of the semiconductor laser chips 520 is arranged in an array along the lengthwise direction of the light modulator array 46 so as to irradiate a linear laser light which extends in a lengthwise direction of the elongated light modulator array 46.

As described above, the laser lights emitted from the gallium nitride semiconductor lasers 530 are collimated by the corresponding collimator lenses 540, and then enter the optical fiber 41. If seven semiconductor lasers 530 are provided at each of the semiconductor laser chips 520, seven collimated laser lights are optically coupled to the fiber 41 by using the aspheric glass mold lens 550. When 100 fibers each having a core diameter of 25 µm, NA=0.3, and each outputting power 0.5 W are arranged, super high power linear beams of 50 W (=0.5 W×100) can be emitted. The linear beams are made parallel in the direction of arrow Y by the lenses 43 and 44, and converged in a direction orthogonal to the direction of Y, and incident on the elongated light modulator array 46.

Figure 13A:
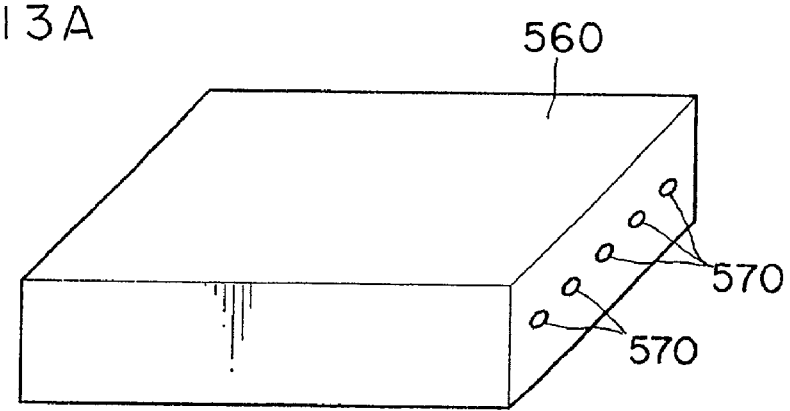
FIG. 13A is a perspective view illustrating another light source used in a fourth embodiment of the present invention.
Figure 13B:
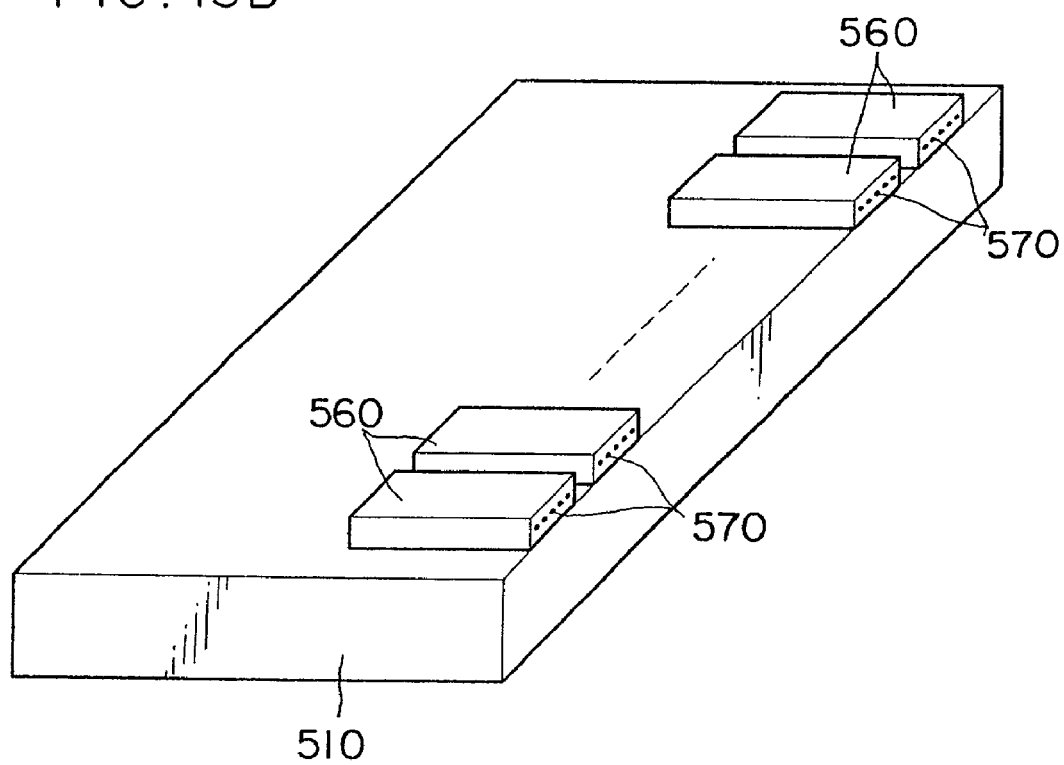
FIG. 13B is a perspective view illustrating another light source used in the fourth embodiment of the present invention.

The linear beams outputting a high power of 50 W (=0.5 W×100) having the aforementioned fibers arranged thereon can be replaced by an array type semiconductor laser which is described in Japanese Patent Application No. 2001-273849 and in which semiconductor laser chips 560 shown in FIG. 13A are arranged in a predetermined direction as shown in FIG. 13B. The light source 42 is structured by a plurality of the semiconductor laser chips 560. Each of the semiconductor laser chips 560 comprises a plurality of light emitting points 570. If the number of the light emitting points 570 is five and each of the light emitting points 570 has an output of 0.1 W, each of the semiconductor laser chips 560 has an output of 0.5 W (=0.1 W×5). Meanwhile, when the light source 42 comprises 34 semiconductor laser chips 560, an array beam outputting a high power of 17 W (=0.5 W×34) can be emitted. When three of this array beam of 17 W are arranged, a high power linear beam of 50 W (=17 W×3) which are almost the same as the beam in which fibers are arranged can be obtained.

Description of an operation of the exposure device according to the present embodiment will be given hereinafter. The image data 38 is inputted to the controller (not shown) of the light modulator arrays 46, and temporarily stored in the frame memory of the controller in order to irradiate the laser light 40 onto, and thereby expose the object to be exposed.

The linear beam which is emitted from the laser light source 42 of the exposure head 14 and which extends in a lengthwise direction of the light modulator array 46 is linearly irradiated onto the elongated light modulator array 46, via the lenses 43 and 44, and modulated at one time by the light modulator array 46, and then linearly focused in Y direction.

When exposure begins, the exposure head 14 moves to a position at which the exposure head 14 starts the exposure (the original points in X and Y directions). When the motor controller 32 rotates the driving motor 76 at a fixed speed, in accordance with the rotation of a supporting shaft due to the driving motor 76, the rotating drum 75 rotates in the direction of arrow X.

In accordance with the rotation of the rotating drum 75 in the direction of arrow X, the image data 38 that is stored in the frame memory is sequentially read in a number of pixel units that substantially corresponds to the number of the GLV elements 201 of the light modulator array 46. In accordance with the read image data 38, each of the GLV elements 201 of the light modulator array 46 is switched on/off. Therefore, the laser light 40 emitted from the exposure head 14 is on/off. The object to be exposed 10 is scanned and exposed in the direction of arrow Y in a number of pixel units that substantially corresponds to the number of the GLV elements 201, and also scanned and exposed in the circumferential direction of the rotating drum 75 (mainscan).

When the rotating drum 75 rotates once, the motor controller 32 causes the driving motor 30 to rotate at a fixed speed. The lead screw 28 also rotates at a fixed speed. Due to the rotation of the lead screw 28, the exposure head 14 moves one step in the direction of arrow Y (sub-scan). By repeating such main-scanning and sub-scanning operations, the object to be exposed 10 is imagewise-exposed. Further, the driving motor 75 is rotated constantly at a fixed speed so as to move the driving motor 30 by one step for each rotation of the drum, whereby the object to be exposed 10 can be exposed spirally.

As described above, in the same manner as in the first embodiment of the present invention, since the exposure device of the present embodiment uses a high-power laser light source, the object to be exposed that is sensitive to a predetermined wavelength region including a UV region can directly be scanned and exposed on the basis of digital data. Accordingly, the exposure device according to the present embodiment is more advantageous with regard to the (1) to (6) than an exposure device using a proximity method that performs mask alignment exposure.

Figure 15:
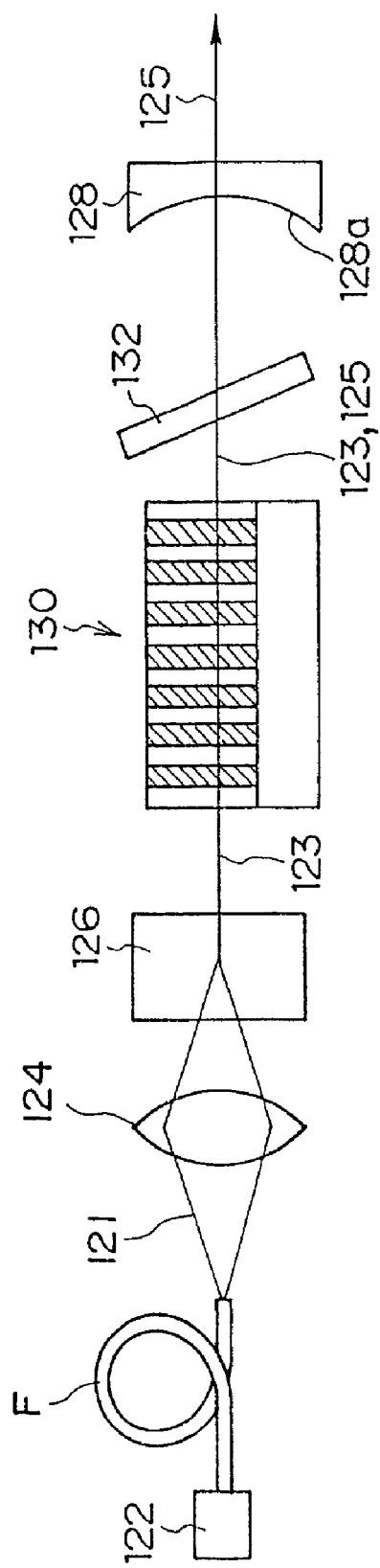
FIG. 15 is a schematic cross-sectional view of a semiconductor laser excitation solid-state laser which can be used as a light source in the exposure device of the present invention.
Figure 16:
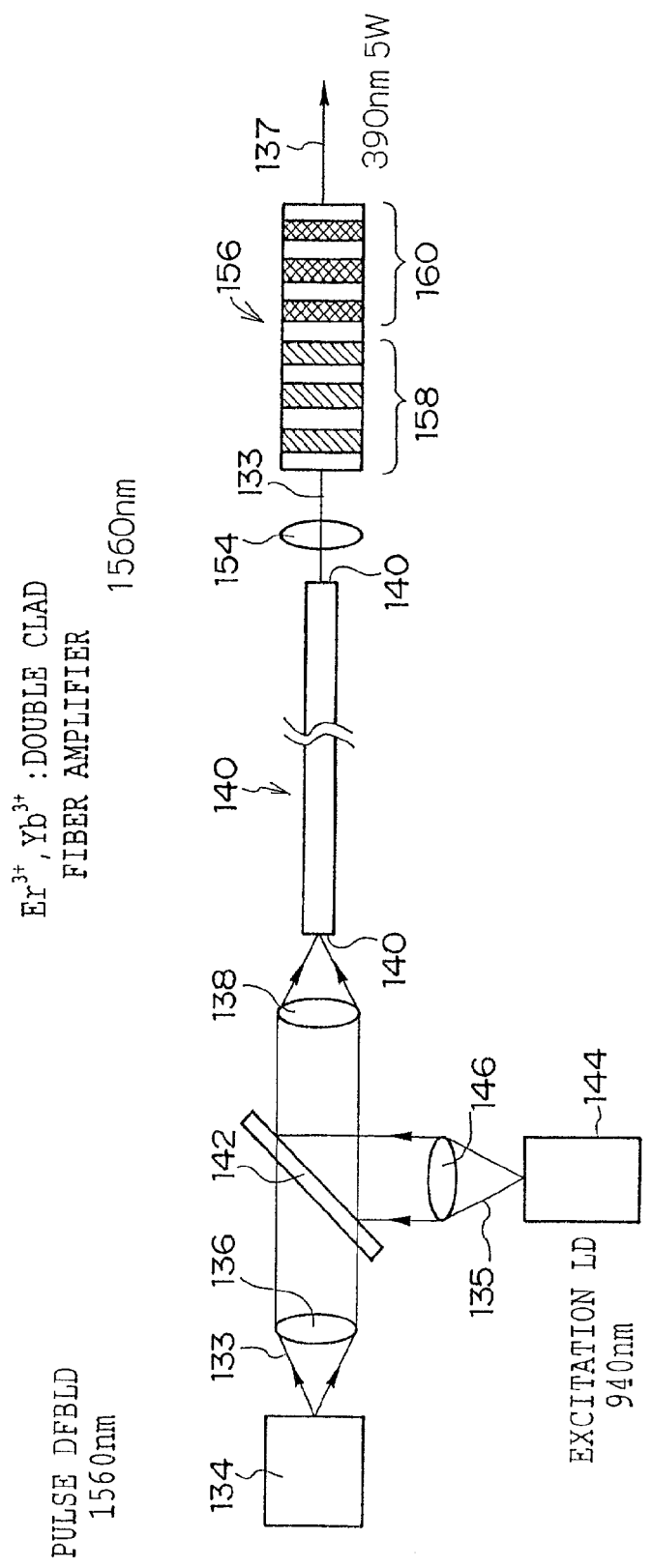
FIG. 16 is a schematic cross-sectional view of an FHG (fourth harmonics generating) fiber laser which can be used as a light source in the exposure device of the present invention.
Figure 17:
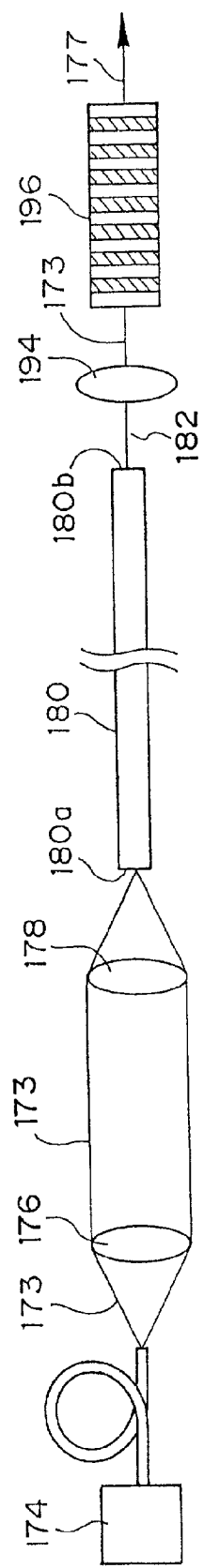
FIG. 17 is a schematic cross-sectional view of an SHG (second harmonics generating) fiber laser which can be used as a light source in the exposure device of the present invention.

In the first to third embodiments of the present invention, examples using the high-power laser light source in which the GaN semiconductor laser is multiplexed to fibers have been explained. However, the high-power laser light source can be structured by any one of (1) to (6):

(1) a gallium nitride semiconductor laser. Preferably, an array type semiconductor laser comprising a plurality of the gallium nitride semiconductor lasers that are shown in FIG. 10, and FIGS. 11A and 11B;

(2) a semiconductor laser excitation solid-state laser shown in FIG. 15 in which a laser beam caused by excitation of a solid-state laser crystal by the gallium nitride semiconductor laser is wavelength-converted by an optical wavelength-converting element, and emitted;

(3) a fiber laser shown in FIG. 16, in which a laser beam caused by excitation of a fiber by the gallium nitride semiconductor laser is wavelength-converted by the optical wavelength-converting element, and emitted;

(4) a fiber laser or fiber amplifier shown in FIG. 17 in which a laser beam caused by excitation of a fiber by an infrared light-emitting semiconductor laser is wavelength-converted by the optical wavelength-converting element, and emitted;

(5) a laser light source in which the gallium nitride semiconductor laser is coupled to the fiber; a laser light source in which the gallium nitride semiconductor lasers are coupled to the fiber by the multiplexing optical system; a linear laser light source in which the fiber shown in FIG. 12 is arranged in an array; and an area laser light source in which the fiber shown in FIG. 12 is arranged in a bundle; and (6) a laser light source comprising one of those described in the (1) to (5) and the multiplexing optical system.

FIG. 14 shows an example of a layer structure of the (1) GaN semiconductor laser having a broad area light-emitting region. The layer-structured GaN semiconductor laser comprises an n type GaN (0001) substrate 100, sequentially on the n type GaN (0001) substrate 100, an n type $Ga_{1-z1}Al_{z1}N$/GaN superlattice clad layer 102 ($0.05<z1<1$), an n type or i type GaN optical waveguide layer 104, an $In_{1-z2}Ga1_{z2}N$(Si doped)/$In_{z3}Ga1_{z3}N$ multiple quantum well active layer 106 ($0.01<z2<0.05$, $0.1<z3<0.3$), a p type $Ga_{0.8}Al_{0.2}N$ carrier blocking layer 108, an n type or i type GaN optical waveguide layer 110, a p type $Ga_{1-z1}Al_{z1}N$/GaN superlattice clad layer 112, and a p type GaN contact layer 114. An insulating film 116 is formed on the p type GaN contact layer 114 at a region excluding a stripe portion having about 50 μm width and having a p-electrode 118 formed thereon. An n-electrode 120 is formed at a rear surface of the n type GaN (0001) substrate 100. Further, since an oscillating wavelength region of this semiconductor laser is 440 nm and a light emitting region width is 50 μm, a power of about 1 W is outputted, and an electricity-light conversion rate is 15%.

A laser light comprising ten elements from the semiconductor laser is inputted to a fiber whose core diameter is 500 μm to thereby obtain a fiber excitation module 122 outputting a power of 10 W.

FIG. 15 shows an example of a semiconductor laser excitation solid-state laser in which a laser beam caused by excitation of a solid-state laser crystal by using the (2) gallium nitride semiconductor lasers is wavelength-converted by the optical wavelength-converting element, and emitted. This semiconductor laser excitation solid-state laser comprises an excitation module 122 which emits a laser beam 121 as an excitation light, a fiber F whose irradiated end is optically coupled to the excitation module 122, a condensing lens 124 which condenses the laser beam 121 as a divergent light which is emitted from the fiber F, an $LiYF_4$ crystal 126 which is a $Pr^{3+}$ doped solid-state laser medium (hereinafter, a Pr:YLF crystal), a resonator mirror 128 which is disposed at the light emitting side of the Pr:YLF crystal, an optical wavelength-converting element 130 which is disposed between the Pr:YLF crystal 126 and the resonator mirror 128, and etalon 132.

The optical wavelength-converting element 130 is structured such that a periodic domain-inverting structure is provided at an MgO-doped $LiNbO_3$ crystal which is a non-linear optical material. For example, when a fundamental wavelength is 720 nm and a wavelength of second harmonics is 360 nm, a period of the periodic domain inverting structure is 1.65 μm such that the period becomes a primary period relative to these wavelengths. Further, the etalon 132 as a wavelength-selecting element allows a solid-state laser to oscillate in a single vertical mode thus enabling noise reduction.

For example, the semiconductor laser 122 can use one of a broad area type which has an InGaN active layer and which oscillates at a wavelength of 450 nm. An end surface 126a at the light incident side of the Pr:YLF crystal 126 is coated so as to effectively transmit light of a wavelength of 450 nm therethrough at a transmittance of 80% or more. The coating reflects light of a wavelength of 720 nm that is one of the $Pr^{3+}$ oscillating lines at a high reflectance while reflecting light of wavelengths 400 to 650 and 800 nm or more that are the other $Pr^{3+}$ oscillating lines at a low reflectance. Further, an end surface 126b of the Pr:YLF crystal 126 is coated so as to reflect light of a wavelength 720 nm at a low reflectance while reflecting light of second harmonics with a wavelength 360 nm at a high reflectance. Further, a mirror surface 128a of the resonator mirror 128 is coated so as to reflect light of a wavelength 720 nm at a high reflectance, transmit light of a wavelength 360 nm therethrough at a transmittance of 95% or more, and reflect light of the aforementioned wavelengths 400 to 650 nm and 800 nm or more at a low reflectance.

In the semiconductor laser excitation solid-state laser, the laser beam 121 of a wavelength 450 nm emitted from the semiconductor laser 122 enteres the Pr:YLF crystal 126 through the end surface 126a. $Pr^{3+}$ of the Pr:YLF crystal 126 is excited by the laser beam 121 to emit light of a wavelength 720 nm. The level transition of the Pr:YLF crystal 126 at this time is considered to be $^3P_0 \rightarrow {}^3F_4$. A resonator comprising the end surface 126a of the Pr:YLF crystal 126 and the mirror surface 128a of the resonator mirror 128 triggers laser oscillation, and outputs a solid-state laser beam 123 of a wavelength 720 nm. The laser beam 123 enters the optical wavelength-converting element 130, and is wavelength-converted to a second harmonics 125 of a wavelength ½ i.e., 360 nm. Since the mirror surface 128a of the resonator mirror 128 is coated as described above, the resonator mirror 128 emits only the second harmonics 125 of about a wavelength 360 nm.

FIG. 16 shows an example of the (4) fiber laser in which a laser beam obtained by exciting a fiber by an infrared light-emitting semiconductor laser, is wavelength-converted by the optical wavelength-converting element, and emitted. This fiber laser is a THG (third harmonics) fiber laser, and comprises a pulse distribution feedback semiconductor laser (pulse DFB laser) 134 for emitting a laser beam 133 of a wavelength 1560 nm, a collimator lens 136 for making the laser beam 133 as a divergent light parallel, a condensing lens 138 for condensing the laser beam 133 made parallel, a half mirror 142 which is arranged between the collimator lens 136 and the condensing lens 138, a fiber 140 whose core is $Er^{3+}$ and $Yb^{3+}$ doped, a condensing lens 154 for condensing the laser beam 133 emitted from the fiber 140, and a wavelength-converting portion 156 which receives and converts the condensed laser beam 133 to a wavelength-converted wave.

The wavelength-converting portion 156 comprises an SHG (second harmonics generating) element 158 for converting the laser beam 133 to ½ of a wavelength (i.e., 780 nm), an FHG (fourth harmonics generating) element 160 for converting the laser beam 133 to ¼ of a wavelength (i.e., 390 nm). The SHG element 156 and the THG element 158 are bulk type wavelength-converting crystals which are non-linear optical materials, and in which a periodic domain inverting structure is provided at the MgO-doped $LiNbO_3$.

A semiconductor laser 144 emitting a laser beam 135 of a wavelength 940 nm is arranged at a reflective light incident side of the half mirror 142 (beneath the half mirror 142 in FIG. 16). A collimator lens 146 is arranged between the half mirror 142 and the semiconductor laser 144.

As shown in FIG. 16, in the fiber 140, upon receiving energy from a fluorescence of the same wavelength 1560 nm, the laser beam 133 is amplified, and then emitted from a light emitting end surface 140b of the fiber 140. The emitted laser beam 133 of a wavelength 1560 nm is condensed by the condensing lens 154, and enters the wavelength-converting portion 156. At the wavelength-converting portion 156, the laser beam 133 is wavelength-converted to a laser beam 137 of a wavelength 390 nm as a fourth harmonics, and then emitted. Further, the FHG fiber laser can output a power of 5 W.

The wavelength-converting portion is structured by an SHG (second harmonics generating) element for converting the received laser beam to a laser beam of ½ wavelength, and a THG (third harmonics generating) element for converting the received laser beam to a laser beam of ⅓ wavelength to form a THG (third harmonics generating) fiber laser.

FIG. 17 shows an example of a fiber laser in which a laser beam caused by excitation of a fiber by a fiber inputting excitation module using the gallium nitride semiconductor laser is wavelength-converted by the optical wavelength-converting element, and emitted as described in the (3). This fiber laser is an SHG (second harmonics generating) fiber laser, and comprises: a fiber inputting excitation module 174 using a GaN semiconductor laser for emitting a laser beam 173 of a wavelength 450 nm; a collimator lens 176 for making parallel the laser beam 173 which is a divergent light, a condensing lens 178 for condensing the laser beam which is made parallel; a fiber 180 whose core is $Pr^{3+}$ doped; a condensing lens 194 for condensing a laser beam 18 of a wavelength 720 nm which is emitted from the fiber 180; and an SHG (second harmonics generating) element 196 for receiving the condensed laser beam 182 and converting to a laser beam 177 of ½ wavelength (360 nm). The SHG element 196 is a bulk type wavelength-converting crystal having a structure in which the MgO-doped $LiNbO_3$ comprises a periodic domain inverting structure. End surfaces 180a and 180b of the fiber 180 is coated with the characteristics of becoming AR (areflexia) to light of each of the wavelengths described above.

In this fiber laser, the laser beam 173 of a wavelength 450 nm, which is emitted from the fiber inputting excitation module 174 using the GaN semiconductor laser, is condensed by the condensing lens 178, and enters the fiber 180. A fluorescence of a wavelength 720 nm is generated by the received laser beam 173, and the fluorescence is resonated between the end surfaces 180a and 180b, whereby the laser beam 182 of a wavelength 720 nm is emitted from the emitting end surface 180b. The emitted laser beam 182 of a wavelength 720 nm is condensed by the condensing lens 194, and enters an SHG element 196. At the SHG element 196, the received laser beam 182 is wavelength-converted to the laser beam 177 of a wavelength 360 nm that is a second harmonics, and then emitted.

Figure 18:
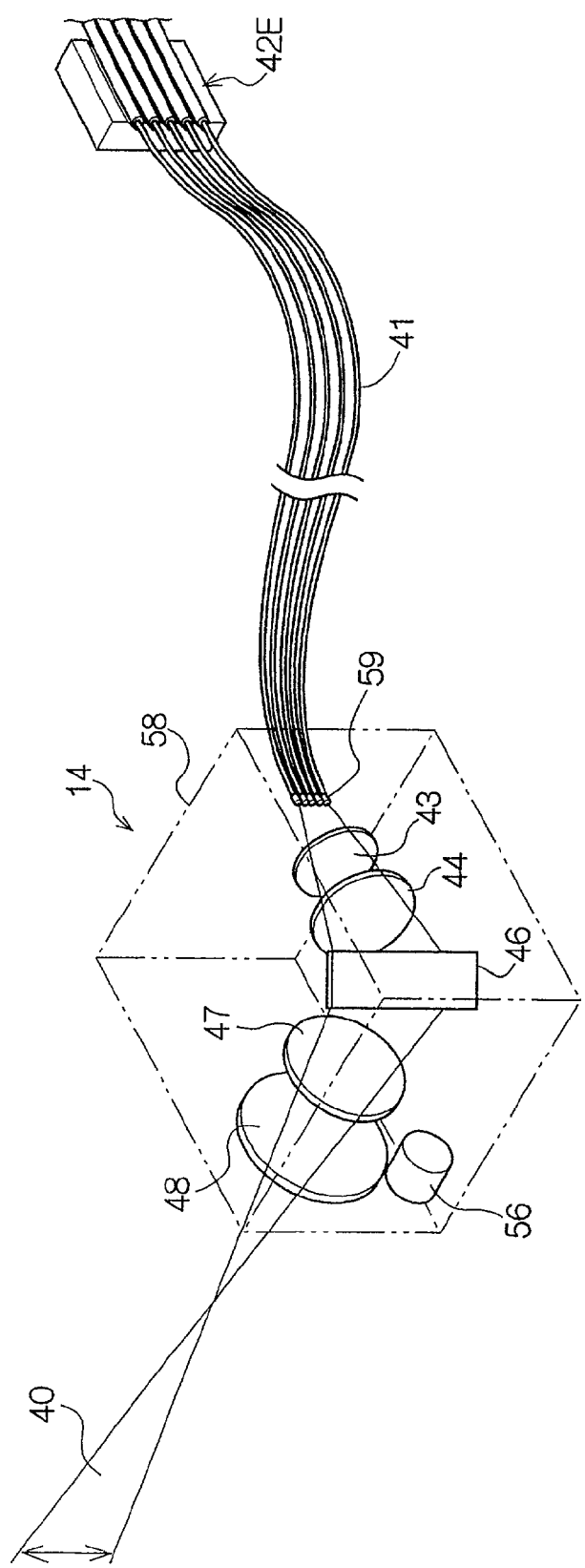
FIG. 18 is a perspective view of a different example of the exposure head of the exposure device according to the first embodiment of the present invention.

In the first to third embodiments of the present invention, an example in which the high-power laser light source is disposed inside the exposure head has been described. However, the high-power laser light source can be arranged outside the exposure head. FIG. 18 shows an example in which the high-power laser light source is disposed outside the exposure head. In the exposure head 14, a laser light source 42E is disposed outside the casing 58, and the optical fiber 41 introduced into casing 58, through the hole (not shown) formed at the sidewall of the casing 58. Since the exposure head 14 of the present embodiment is structured in the same manner as in the first embodiment of the present invention except for this, portions identical to those in the first embodiment of the present invention are denoted by the same reference numerals and a description thereof will be omitted.

In the above-described first to third embodiments of the present invention, descriptions of examples in which light beams are modulated by using the light modulator array in which a reflective grating type GLV (Grating Light Valve) element i.e., an MEMS (Micro Electro Mechanical Systems) type spatial light modulator (SLM; Spatial Light Modulator) is arranged in an array. The light beams can be modulated by another modulating portion. Further, the term "MEMS" is a general term for a micro-size sensor which is manufactured by using a micro-machining technology on the basis of an IC manufacturing process, actuators, and a fine system in which control circuits are integrated. The MEMS type spatial light modulator represents a spatial light modulator to be driven by electrical mechanical operations using electrostatic power.

For example, when a laser light source which is continuously driven and whose amount of the light outputted is small is used, the laser light source can be modulated by a spatial light modulator such as an optical element (PLZT element) or a liquid crystal light shutter (FLC) for modulating transmitting light due to electric optical effects, other than the MEMS type spatial light modulator. Further, a laser beam having a laser source which is pulse-driven and outputs a large amount of light can be modulated by a spatial light modulator such as another MEMS type spatial light modulator such as a digital micromirror device (DMD), a full-reflective type spatial light modulator, or a coherent spatial light modulator.

The spatial light modulator (the light modulator array) is not strictly limited to one dimension (i.e., the number of either one of two dimensional elements is one) linear arrangement, and instead, can be arranged in any linear arrangement as long as the number of two dimensional elements in one dimension is sufficiently smaller than that of the other. By structuring the light modulator array in an area state or a linear state, a region of the light modulator array corresponding to a plurality of pixels on a recording material can be exposed at one time, and exposure at higher speed is made possible. However, if the light modulator array is in the area state (two-dimensional), two dimensions must be aligned accurately in order to form a continuous image that was exposed by the light modulator arrays in the respective two dimensions, and an optical system or the like must be used to prevent the focused image from being distorted, thereby forming an arc-shape. Accordingly, a problem occurs in that the device has a complicated structure, and is manufactured at greater expense. Further, a problem similar to the problem described above occurs when multiple light modulator arrays are used in order to increase the exposure speed. It is only necessary that the light modulator array in the linear state be adjusted in order to form a continuous image only in a direction in which the arrays are arranged. Moreover, because the linear light modulator array is a cross-section that passes through the center of the optical system, it is advantageous in that the problem of the arc-shaped distortion of the focused image can be prevented.

Consequently, in the first to third embodiments of the present invention, it is more preferable that the light modulator array be formed in the linear state. Further, from a viewpoint of lighting efficiency, a light source in an array state in which multiple fiber light sources are arranged to form a linear lighting light source is preferable as the light sources used for illuminating the aforementioned linear light modulator array as described above.

In the first to third embodiments of the present invention, the fibers are disposed in an array state. However, the present invention is not limited to this, and instead, the fibers can be arranged in a bundle state to generate a laser light in an area state. In this case, it is preferable to use the light modulator array that is two dimensional from the viewpoint of the lighting efficiency.

Figure 19A:
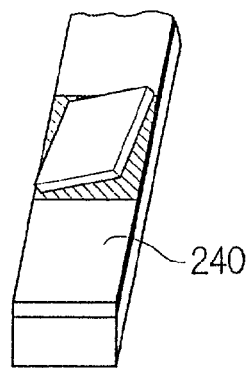
FIG. 19A is a partially enlarged structural view of a DMD.
Figure 19B:
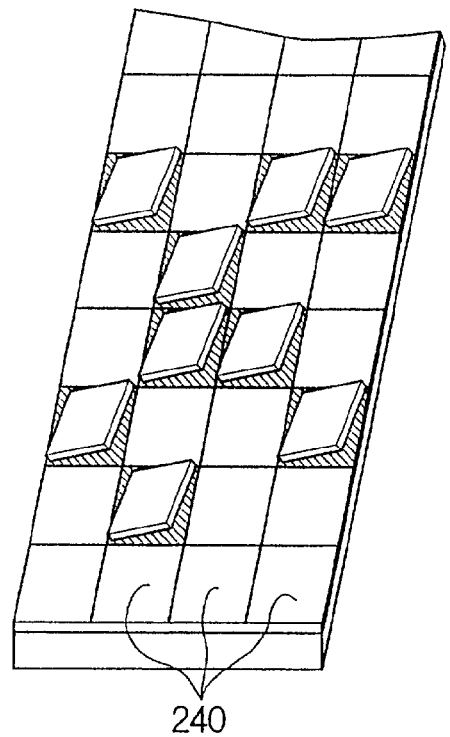
FIG. 19B is a partially enlarged structural view of the DMD.
Figure 19C:
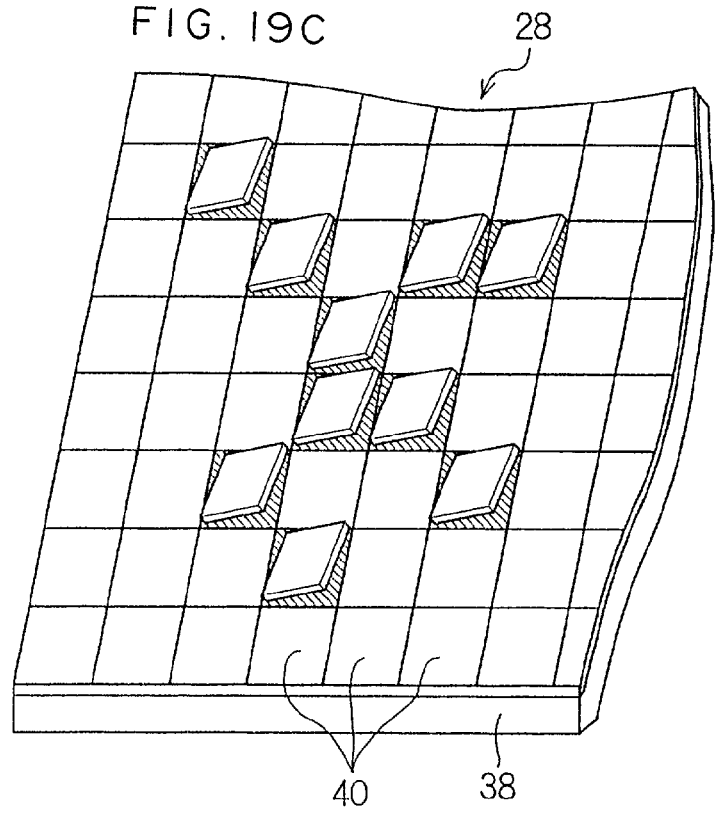
FIG. 19C is a partially enlarged structural view of the DMD.

As shown in FIGS. 19A to 19C, a DMD is a mirror device in which fine mirrors (micromirrors) 240, which are supported by a support, are disposed on an SRAM cell (memory cell) 238, and pixels comprising multiple fine mirrors (several hundred thousand to several million) are arranged in a lattice state. FIG. 19A shows a DMD with pixels arranged in a row, FIG. 19B shows a DMD with pixels arranged in multiple rows, and FIG. 19C shows a DMD with pixels arranged two-dimensionally. In the present embodiment, as shown in FIGS. 19A and 19B, it is preferable to use a DMD with pixels arranged linearly. Each pixel has one micromirror 240 at the uppermost portion that is supported by the support, and aluminum is deposited on the surface of the micromirror 240. A silicon gate CMOS-SRAM cell 238, which is manufactured on a manufacturing line of an ordinary semiconductor memory, is disposed directly beneath the micromirror 240, through a support including a hinge and a yoke, and the entire body is formed monolithically (in one piece).

Figure 20A:
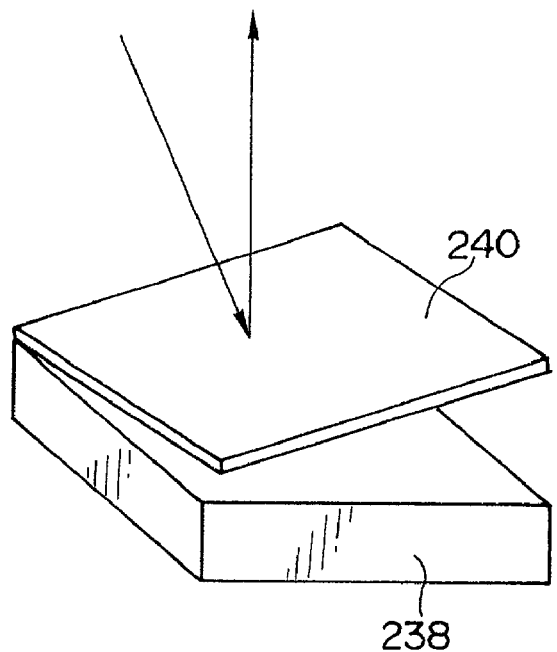
FIGS. 20A and 20B are explanatory views for explaining the operation of the DMD.
Figure 20B:
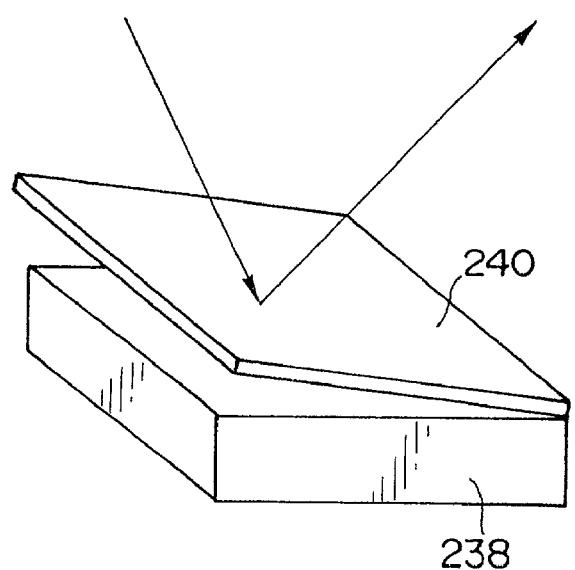

When a digital signal is written into the SRAM cell 238 of the DMD, each micromirror 240 supported by the support is inclined within a range of $\pm\alpha°$ (e.g. $\pm10°$) with respect to the substrate side at which the DMD is disposed, with a diagonal line as the central axis. FIG. 20A shows on-state in which the micromirror 240 is inclines at +α°. FIG. 20B shows off-state in which the micromirror 240 inclines at −α°. Therefore, as shown in FIGS. 19A to 19C, inclination of the micromirror 240 with respect to each pixel of the DMD is controlled in accordance with an image signal, whereby light entering the DMD is reflected in the direction in which the micromirror 240 is inclined. Moreover, FIGS. 19A to 19C respectively show a partial enlargement view of the structure of the DMD in which the micromirror 240 is controlled to be angled at +α° or −α°. Each micromirror 240 is on/off controlled by a controller (not shown) connected to the DMD. Moreover, a light absorber (not shown) is disposed in a direction in which light beams is reflected by the micromirrors 240 in off-state.

Figure 21:
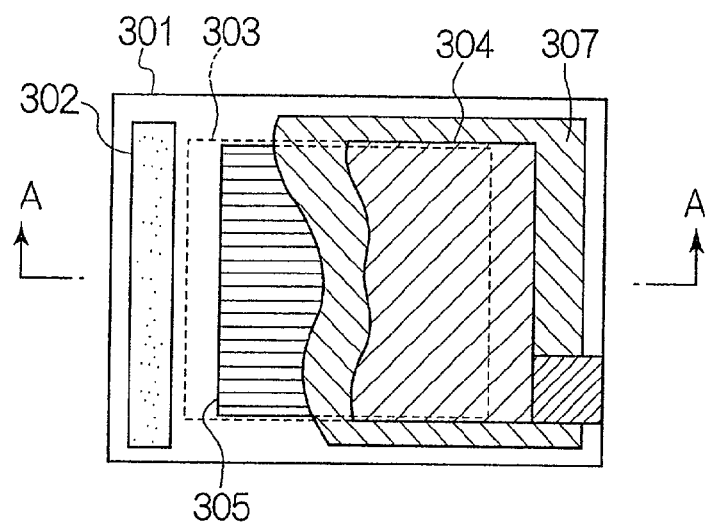
FIG. 21 is a plan view of an example of a coherent spatial light modulator.

An example of the coherent spatial light modulator includes a light modulator (a coherent optical shutter) using a Fabry-Perot coherence. As shown in FIGS. 21 and 21, the coherent optical shutter comprises one electrode 303 which is disposed at a predetermined angle with respect to incident light, another electrode 304 which is disposed so as to face the one electrode 303 and separated therefrom at a gap; and a transparent flexible thin film 307 which is interposed between the one electrode 303 and the another electrode 304. On receiving Coulomb force that is generated by applying a voltage between the one electrode 303 and the another electrode 304, the coherent optical shutter flexes the flexible thin film 307, modulates the light transmitted through the flexible thin film 307, and emits the light.

The one electrode 303 is structured by being incorporated in a transparent substrate 301, and a dielectric multilayer mirror 305 is disposed above the one electrode 303. The transparent substrate 301 has supports 302 disposed at both sides thereon. The flexible thin film 307 is provided at the upper ends of the supports 302. Another dielectric multilayer mirror 306 is provided at the bottom surface of the flexible thin film 307 so as to face the dielectric multilayer mirror 305. Accordingly, the gap 309 is formed between the upper dielectric multilayer mirror 305 and the lower dielectric multiplayer mirror 306. Further, the another electrode 304 is disposed on top of the flexible thin film 307 so as to face the one electrode 303.

In the coherent optical shutter which is structured like this, as shown in FIG. 23A, when power supply of a power voltage $V_{gs}$ into the electrode 303 and the electrode 304 is switched off, the gap 309 between the dielectric multilayer mirrors 305 and 306 becomes t-off. As shown in FIG. 23B, when power supply of the power voltage $V_{gs}$ into the first electrode 303 and the second electrode 304 is on, the gap 309 between the dielectric multilayer mirrors 305 and 306 becomes t-on. Namely, when the voltage $V_{gs}$ is applied between the electrodes 303 and 304, Coulomb force is generated to deform the flexible thin film 307, whereby the gap 309 becomes tight.

Here, t-off can be controlled during the formation of the flexible thin film 307. Further, t-on can be controlled by balancing the voltage $V_{gs}$ and a restoring force generated when the flexible thin film 307 deformed. In order to provide more constant control, a spacer can be formed between the electrode 303 and the flexible thin film 307 so as to keep the deformation constant. When the spacer is dielectric, it can provide an effect of reducing the applied voltage by its dielectric constant (1 or more). When the spacer is electrically conductive, the better effect can be provided. Further, the electrodes 303 and 304 can be formed by the same material.

Figure 22:
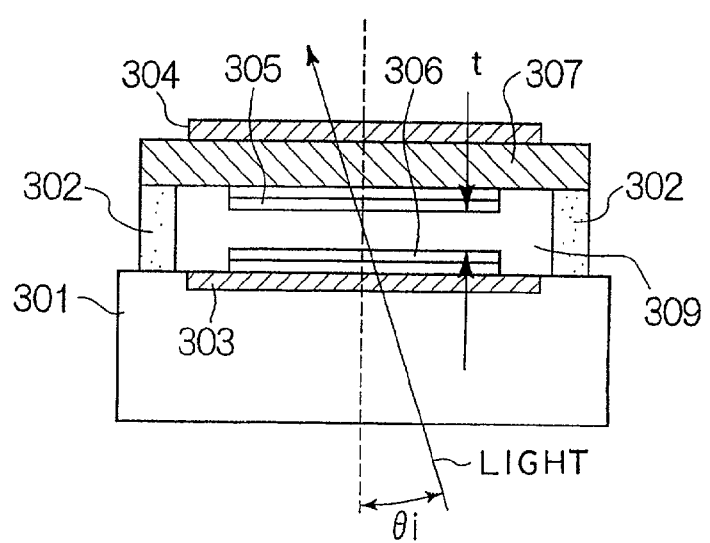
FIG. 22 is a cross-sectional view of FIG. 21 taken along line A—A.

As shown in FIG. 22, when an angle between a normal of the surface of the shutter and incident light is $\theta_i$, light intensity transmittance It of the coherent optical shutter is represented by the following equation. In this equation, R represents a light intensity reflectance of each of the multilayer mirrors 305 and 306, n represents a refractive index of the gap 309 (1 in the case of air), t represents a length of the gap 309 between the dielectric multilayer mirrors 305 and 306, and λ represents an optical wavelength.

$$It = \frac{1}{1 + 4R\sin^2\left[\frac{2\pi n t \cos\theta_i}{\lambda}\right]\frac{1}{(1-R)^2}} \quad (3)$$

wherein t-on and t-off are determined as below (m=1): t-on=½×λ[nm], t-off=¾×λ[nm], and λ=405 nm. Further, the light intensity reflectance of each of the dielectric multilayer mirrors 305 and 306 is represented by R=0.9, incident angle is represented by $\theta_i$=0[deg], and the reflective index of the gap 309 is represented by n=1 (when the gap 309 is air or noble gas). Characteristics of the coherent optical shutter with respect to a wavelength of the light intensity transmittance are such that the shutter does not transmit light when the voltage $V_{gs}$ is not applied (in the case of t-off), and transmits light which is mainly emitted from the semiconductor laser light whose wavelength is 405 [nm] when the voltage $V_{gs}$ is applied (in the case of t-on) the shutter.

The coherent optical shutter receives the Coulomb force generated by the application of the voltage $V_{gs}$ between the electrodes 303 and 304, flexes the flexible thin film 307, generates multilayer coherent effect, and is able to optically modulate the transmitted light through the flexible thin film 307. Further, arbitrary combination of a distance t of the gap 309, a reflex index n, light intensity reflectance R of each of the dielectric multiplayer mirrors 305 and 306, and the like can be used provided that coherence conditions are satisfied. Moreover, when the distance t is sequentially changed on the basis of the value of the voltage $V_{gs}$, the central wavelength of a transmitting spectrum can arbitrarily be changed, whereby an amount of the transmitted light can be controlled continuously. Namely, gradation control due to the applied voltage is enabled.

Figure 24:
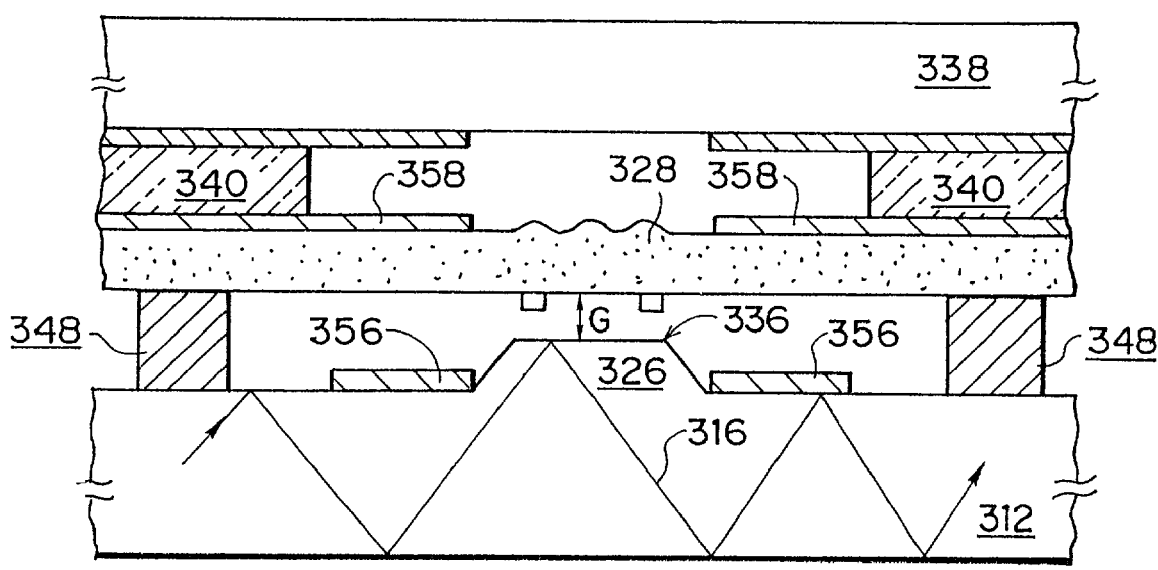
FIG. 24 is a schematic cross-sectional view of an example of a total reflective spatial light modulator.
Figure 25:
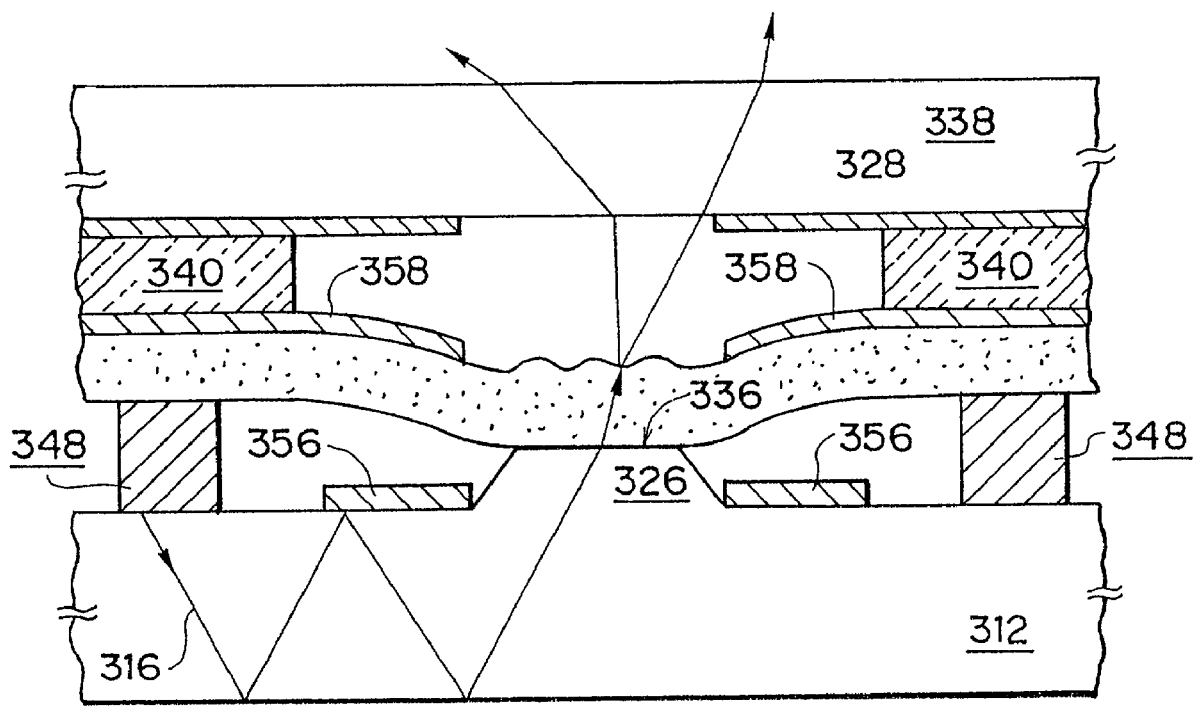
FIG. 25 is an explanatory view of an operational state of the total reflective spatial light modulator of FIG. 24.

As shown in FIG. 24 and FIG. 25, in an example of a mechanical optical tap driving structure, the full-reflective light modulator has a normally-on optical tap structure. Here, an optical inducing plate mesa 326 is disposed at a lower position than spacers 348 on the optical introducing plate mesa 326. Line electrodes 356 are disposed in the vicinities of the spacers 348. Column electrodes 358 corresponding to the line electrodes 356 are disposed on top of a mechanical tap film 328. Due to a tensile nature of the mechanical tap film 328 which is normally-on structured, the level of the spacers 348 above the mesa become higher. Accordingly, the mechanical tap film 328 is held in a state of being separated from the upper surface 336 of the optical inducing plate mesa 326. A gap G of about 0.7 µm between the tap film 328 and the top surface 336 of the mesa 326 inhibits the light emitted from the optical inducing plate 312 from transmitting through the tap film 328, and a transmitting substrate 338 disposed above the tap film 328. In this state (on-state), the light enters from the left hand side of the plate 312 and emits from the right hand side thereof in FIG. 25, whereby the light can be used for exposure. On the other hand, when an appropriate potential difference is applied between the ling electrodes 356 and the column electrodes 358, these electrodes are electrically charged (not shown). As a result, the flexible tap film 328 is attracted to the optical inducing plate mesa 326 and the line electrodes 356. This positive attraction allows the tap film 328 to flex downwards, whereby the tap film 328 is moved to be kept in contact with the top surface 336 of the optical inducing plate mesa 326. As shown in FIG. 24, this sets the mechanical optical tap film 328 in off-state, and the light emitted from the optical inducing plate mesa 326 is transmitted through the mechanical tap film 328 contacting therewith, and through the transmitting substrate 338, and then escapes upwardly in this figure. In this off-state, the light entered from the left-hand side of the optical inducing plate 312 does not emit from the right-hand side thereof, and the light cannot be used for exposure. By removing electrode potentials which are attractive to each other, the tensional mechanical tap film 328 is snapped back upwardly to an ordinary rest position. The tap film 328 is separated from the top surface 336 of the optical inducing plate mesa 326, and the mechanical tap film 328 returns to on-state.

In the first to third embodiments of the present invention, an example has been explained in which the exposure device of the present invention is applied to the exposure of a photoresist during the manufacturing process of the liquid crystal color filter. However, the object to be exposed is not limited to the photoresist as long as it is a photosensitive material that is sensitive to a predetermined wavelength region including a UV region. The exposure device of the present invention can expose a photoresist for manufacturing a printed circuit board, a photosensitive cylinder for printing, a cylinder having a photosensitive material for printing coated thereon, and a planographic printing plate. Examples of the present invention being applied to various use are shown in Table 1:

In the exposure device, the exposure head 14 has an exposure unit comprising the high-power laser light source 42, a collimator lens 60, an external modulator 62 such as an AOM (acoustic light modulator), a cylindrical lens 64, a polygon mirror 66, and an fO lens 68. In the same manner as a conventionally known light beam scanner, the collimator lens 60, the external modulator 62, and the cylindrical lens 64 are arranged at the laser light emitting side of the laser light source 42, and an N-angled column shaped polygon mirror 66 having multiple light reflecting surfaces formed at the peripheral portion is arranged at the laser light emitting side of the cylindrical lens 64. The fθ lens 68 is arranged at the laser light emitting side of the polygon mirror 66.

Each member for structuring the exposure unit is housed in the casing 58. The laser light source 42, the collimator lens 60, the external modulator 62, the cylindrical lens 64, the polygon mirror 66, and the fθ lens 68 are fixed to the casing 58 by unillustrated fixing members. The laser light 40 emitted from the fθ lens 68 is irradiated onto the surface of the object to be exposed 10, through the opening (not shown) formed at the casing 58.

The rotation axis of the polygon mirror 66 is coupled to a scanner motor 70, and the scanner motor 70 is connected to the motor controller 32. Thus, in accordance with the rotation of the scanner motor 70, the polygon mirror 66 rotates in a predetermined direction.

The external modulator 62 is connected to a modulation signal generator 74 for generating a modulation signal. The modulation signal generator 74 is connected to a clock signal generator 72. The clock signal generator 72 is connected to the temperature detection circuit 36. In accordance

TABLE 1

|  | Liquid crystal CF exposure device flat bed | Liquid crystal CF exposure device outer drum | PCB exposure device flat bed | PCB exposure device outer drum |
| --- | --- | --- | --- | --- |
| Resolution | 1 µm | 1 µm | 10 µm | 10 µm |
| Exposure size | 1 m to 2 m | 1 m | 0.7 m | 0.7 m |
| Exposure time | 30 sec to 90 sec | 30 sec | 20 sec | 10 sec |
| Light source power* | 27 W to 36 W | 27 W | 20 W | 20 W |
| Material sensitivity | 40 mJ/cm$^2$ | 40 mJ/cm$^2$ | 40 mJ/cm$^2$ | 40 mJ/cm$^2$ |
| Total number of exposure heads | 100 | 10 | 5 | 2 |
| Total number of channels | 1080 × 100 | 1080 × 10 | 1080 × 5 | 1080 × 1 |
| Recording time per one pixel | 2 µs | 0.25 µs | 7 µs | 3.8 µs |

(Reference Examples)

Figure 26:
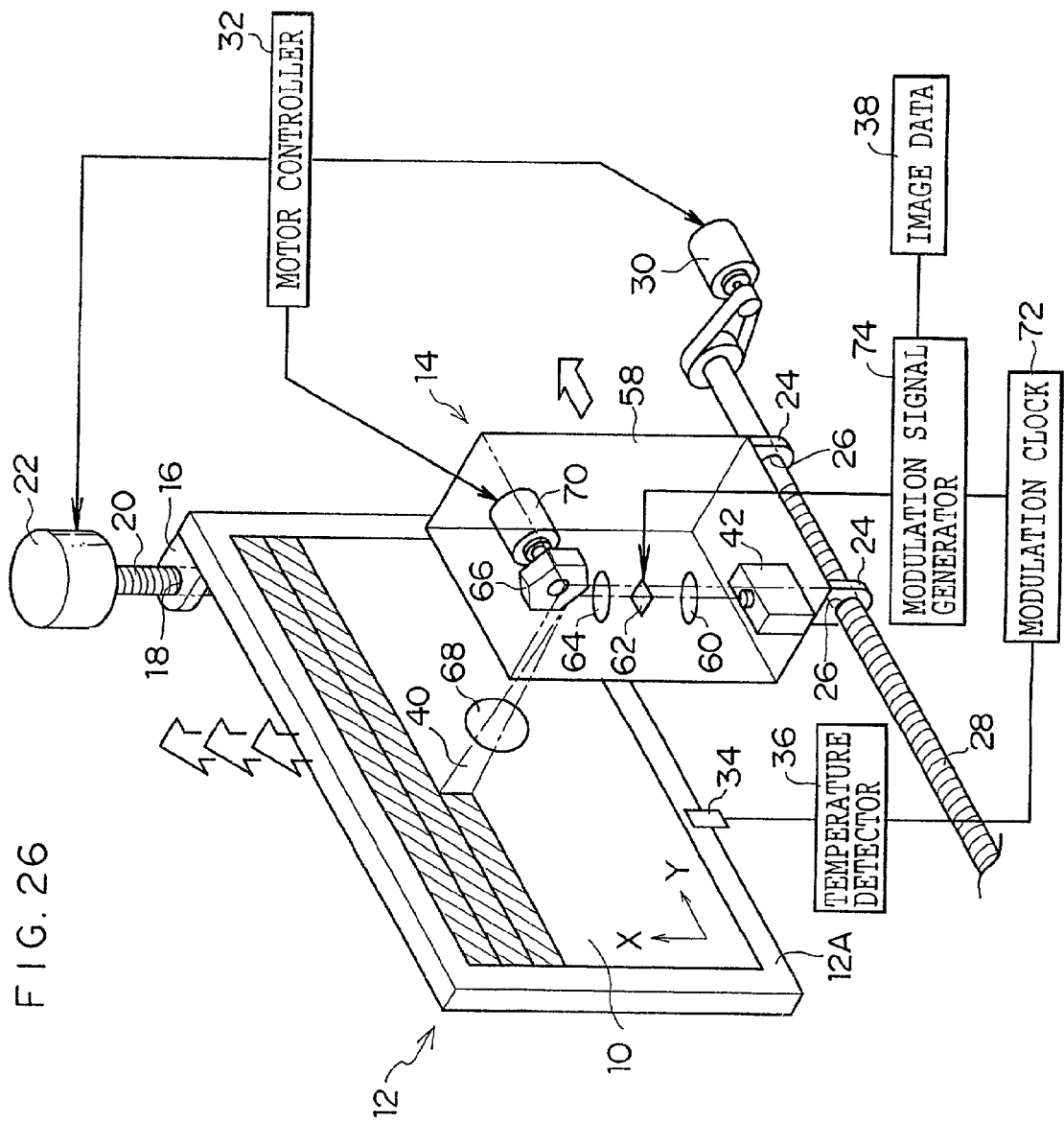
FIG. 26 is a perspective structural view of a conventional exposure device.

With reference to FIG. 26, description of an exposure device as a reference example will be given hereinafter. As shown in FIG. 26, the exposure device comprises an exposure head having an external modulator and a polygon optical system. The exposure device is structured in a manner similar to that in the first embodiment of the present invention except that a laser light modulated by the external modulator is deflected by the polygon optical system and irradiated onto the object to be exposed. Therefore, portions identical to those of that in the first embodiment of the present invention are denoted by the same reference numerals and a description thereof will be omitted.

with the temperature detected by the temperature detection circuit 36, a clock signal having a fixed frequency is generated by the clock signal generator 72, and is outputted to the modulation signal generator 74.

The modulation signal generator 74 generates a modulation signal on the basis of the inputted image data 38, at a timing synchronous with the clock signal inputted from the clock signal generator 72, and outputs the generated modulation signal to the external modulator 62. Further, the laser light source 42 is connected to the unillustrated controller, and the controller controls the laser light source 42 by using the unillustrated driver.

Description of an operation of the exposure device will be given hereinafter. In order to irradiate the laser light 40 onto the object to be exposed to expose the same, the image data 38 is inputted to the modulation signal generator 74, and temporarily stored in the frame memory of the modulation signal generator 74.

The laser lights emitted from the laser light source 42 of the exposure head 14 are made parallel by the collimator lens 60 and incident on the external modulator 62. The incident laser light is modulated by the external modulator 62. When the motor controller 32 causes the scanner motor 70 to rotate at a fixed speed, the polygon mirror 66 rotates in a predetermined direction in accordance with the rotation of the scanner motor 70. The laser light modulated by the external modulator 62 is reflected from the reflecting surfaces of the polygon mirror 66, deflected in a predetermined direction, and is transmitted through the fθ lens 68, and irradiated onto the surface of the object to be exposed 10.

At the start of exposure, the exposure head 14 is moved to a position at which the exposure starts (the original points in X and Y directions). When the motor controller 32 causes the driving motor 30 to rotate at a fixed speed, the lead screw 28 also rotates at a fixed speed, and in accordance with the rotation of the lead screw 28, the exposure head 14 moves at a fixed speed in Y direction.

In accordance with the movement of the exposure head 14 in Y direction, a one line portion of the image data 38 stored in the frame memory is sequentially read by the modulation signal generator 74 in a number of pixel units that substantially corresponds to the number of the pixels to be scanned during one time rotation of the polygon mirror 66. In accordance with the read image data 38, a modulation signal is generated. The generated modulation signal is outputted to the external modulator 62. The generated modulation signal is outputted to the external modulator 62. Accordingly, the incident laser light incident from the collimator lens 60 is turned on/off, and deflected by the polygon mirror 66. Then, the object to be exposed 10 is scanned and exposed in X direction in a unit of the number of the pixels to be scanned by the polygon mirror 66, and scanned and exposed by one line in Y direction (main-scan).

When the exposure head 14 reaches the end portion of the object to be exposed 10, the exposure head 14 returns to the original point in Y direction. Then, when the motor controller 32 causes the driving motor 22 to rotate at a fixed speed, the lead screw 20 also rotates at a fixed speed, and in accordance with the rotation of the lead screw 20, the flat stage 12 moves by one step in X direction (sub-scan). By repeating the main-scanning and the sub-scanning described above, the object to be exposed 10 is imagewise-exposed.

As described above, since the exposure device according to the reference example uses the laser light source outputting high power as in the first embodiment of the present invention, the object to be exposed that is sensitive to a predetermined wavelength region including a UV region can directly be scanned and exposed on the basis of digital data. Accordingly, as compared to an exposure device by using a mask alignment exposure such as the exposure device by the proximity method, the exposure device of the present invention is advantageous in respect of the aforementioned reasons (1) to (6).

However, since the exposure device is used in combination with the external modulator and the polygon mirror, the structure of the device becomes complicated. Further, the external modulator with high durability becomes necessary, the device becomes expensive, and reliability decreases.

Figure 27:
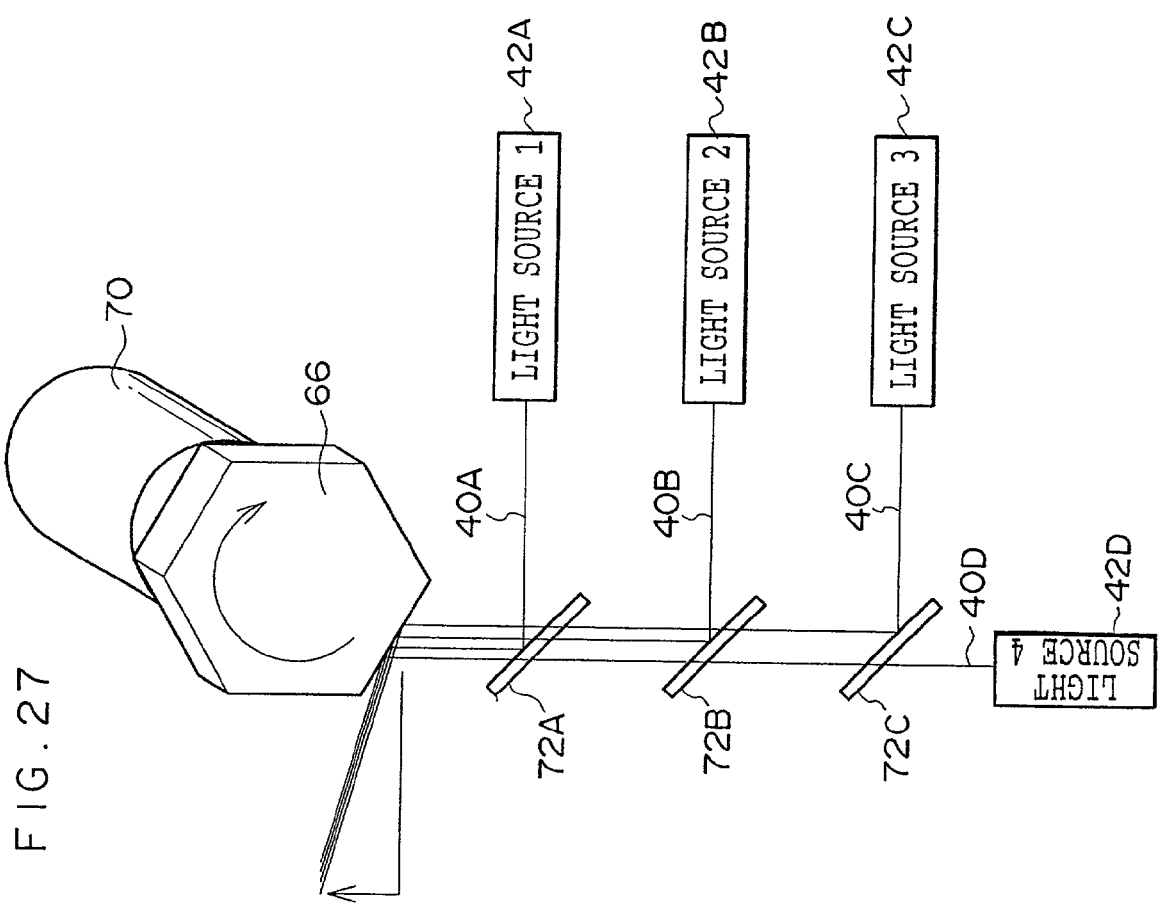
FIG. 27 is a perspective structural view of an exposure head of the conventional exposure device.

In the above-description, an example in which the exposure unit has one single light source has been explained. However, as shown in FIG. 27, the exposure unit comprising multiple light sources can be used. In the exposure unit, four laser light sources 42A, 42B, 42C and 42D and three half mirrors are provided for one polygon mirror 66.

In the exposure unit, the laser light 40A emitted from the laser light source 42A is reflected from a half mirror 72A, made incident on the polygon mirror 66, reflected from the reflecting surface of the polygon mirror 66, and irradiated onto the object to be exposed 10. The laser light 40B emitted from the laser light source 42B is reflected from a half mirror 72B, transmitted through the half mirror 72A, made incident on the polygon mirror 66, reflected from the reflecting surface of the polygon mirror 66, and irradiated onto the object to be exposed 10.

The laser light 40C emitted from the laser light source 42C is reflected from a half mirror 72C, transmitted through the half mirrors 72B and 72A, made incident upon the polygon mirror 66, reflected from the reflecting surface of the polygon mirror 66, and irradiated onto the object to be exposed 10. The laser light 40D emitted from a laser light source 42D is transmitted through the half mirrors 72C, 72B, and 72A, made incident upon the polygon mirror 66, and reflected from the reflecting surface of the polygon mirror 66, and irradiated onto the object to be exposed 10.

In this way, since the object to be exposed 10 is scanned and exposed at one time at different positions in Y direction, exposure at high speed is made possible.

What is claimed is:

1. An exposure device for exposing a photosensitive material in accordance with image data, the exposure device comprising:
    a scanner comprising a high-power laser light source for emitting a light beam within a predetermined wavelength region, which region includes a UV region, the high-power laser light source having a power equal to or greater than 100 mW and a spatial light modulator, the scanner scanning and exposing, in a predetermined scanning direction, a photosensitive material that is sensitive to the predetermined wavelength region, using said light beam which is modulated by said spatial light modular in accordance with image data;
    a first conveyer which moves the photosensitive material in a sub-scanning direction that is a direction intersecting the predetermined main-scanning direction; and
    a second conveyer which moves the scanner in the predetermined main-scanning direction;
    wherein the high-power laser light source comprises at least one of:
        a gallium nitride semiconductor laser;
        a semiconductor laser excitation solid-state laser in which a laser beam, produced by exciting a solid-state laser crystal with a gallium nitride semiconductor laser, is wavelength-converted by an optical wavelength-converting element, and emitted;
        a fiber laser or fiber amplifier in which a laser beam, produced by excitation of a fiber with an infrared light-emitting semiconductor laser, is wavelength-converted by an optical wavelength-converting element, and emitted; and
        a fiber laser in which a laser beam, produced by exciting a fiber with a gallium nitride semiconductor laser, is wavelength-converted by an optical wavelength-converting element, and emitted.

2. The exposure device according to claim 1, wherein said high-power laser light source is pulse-driven.

3. The exposure device according to claim 1, comprising a plurality of the scanners, each of the scanners being movable independently or integrally movable relative to the photosensitive material.

4. The exposure device according to claim 1, wherein the spatial light modulator is driven by an electric mechanical operation using electrostatic force to modulate the light beam.

5. The exposure device according to claim 4, wherein the spatial light modulator comprises a digital micromirror device having multiple movable micromirrors arranged therein.

6. The exposure device according to claim 4, wherein the spatial light modulator comprises grating light valve elements of a reflective diffracting grating type.

7. The exposure device according to claim 6, wherein the spatial light modulator comprises the grating light valve elements of the reflective diffraction grating type in which multiple fixed micro-elements each having a first reflecting surface formed thereon and multiple movable micro-elements each having a second reflecting surface formed thereon are alternately arranged on a substrate surface in a predetermined direction, and when electrostatic force is applied thereto, the movable micro-elements are moved to vary a distance between the first reflecting surface and the second reflecting surface, thereby diffracting incident light.

8. The exposure device according to claim 6, wherein the spatial light modulator is structured as a light modulator array in which multiple grating light valve elements are arranged in a row or rows in a direction substantially orthogonal to the predetermined main-scanning direction.

9. The exposure device according to claim 8, wherein a lengthwise direction of a lattice plate of the grating light valve element corresponds to a direction in which the light modulator array is arranged.

10. The exposure device according to claim 6, wherein the spatial light modulator is arranged to have a direction of axial rotation around a normal line of the modulator surface be at a predetermined angle with respect to an optical axis.

11. The exposure device according to claim 1, wherein the photosensitive material is held on one of a vertical flat stage and a horizontal flat stage.

12. The exposure device according to claim 1, wherein the high-power laser light source comprises a plurality of laser light sources, and a multiplexing optical system for multiplexing the light beams emitted from the plurality of the laser light sources.

13. An exposure device for exposing a photosensitive material in accordance with image data, the exposure device comprising:
    a scanner comprising a high-power laser light source and a spatial light modulator;
        wherein said high-power laser light source emits a light beam within a predetermined wavelength region, said region including a UV region;
        wherein said high-power laser light source has a power equal to or greater than 100 mW; and
        wherein said light beam is modulated by said spatial light modulator in accordance with image data;
    a photosensitive material which is sensitive to said predetermined wavelength region;
    a stage having a substantially flat surface with said photosensitive material disposed thereon; and
    a first conveyer;
    a second conveyer;
    wherein said scanner scans and exposes, in a predetermined main-scanning direction, said photosensitive material, using said light beam;
    wherein said first conveyer moves said stage in a sub-scanning direction that is a direction intersecting said predetermined main-scanning direction;
    wherein said second conveyor moves said scanner in said predetermined main-scanning direction; and
    wherein said high-power laser light source comprises at least one of:
        a gallium nitride semiconductor laser;
        a semiconductor laser excitation solid-state laser in which a laser beam, produced by exciting a solid-state laser crystal with a gallium nitride semiconductor laser, is wavelength-converted by an optical wavelength-converting element, and emitted;
        a fiber laser or fiber amplifier in which a laser beam, produced by excitation of a fiber with an infrared light-emitting semiconductor laser, is wavelength-converted by an optical wavelength-converting element, and emitted; and
        a fiber laser in which a laser beam, produced by exciting a fiber with a gallium nitride semiconductor laser, is wavelength-converted by an optical wavelength-converting element, and emitted.

* * * * *